US006845351B1

United States Patent
Kishimoto et al.

(10) Patent No.: US 6,845,351 B1
(45) Date of Patent: Jan. 18, 2005

(54) SIMULATION DEVICE AND METHOD AND PROGRAM RECORDING MEDIUM

(75) Inventors: Takeshi Kishimoto, Kawasaki (JP); Shinichi Ohtsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/492,464

(22) Filed: Jan. 27, 2000

(30) Foreign Application Priority Data

Jan. 27, 1999 (JP) ............................................ 11-018284

(51) Int. Cl.[7] ................................................ G06F 9/45
(52) U.S. Cl. .............................. 703/14; 703/13; 703/2; 703/5; 703/6; 716/3
(58) Field of Search .............................. 703/2, 5, 6, 14, 703/13

(56) References Cited

U.S. PATENT DOCUMENTS

| 5,650,935 | A | | 7/1997 | Nishino et al. | |
|---|---|---|---|---|---|
| 5,745,370 | A | | 4/1998 | Ohtsu et al. | |
| 5,835,979 | A | | 11/1998 | Hiraki et al. | |
| 5,903,477 | A | * | 5/1999 | Otsu et al. ...................... | 703/5 |
| 5,940,310 | A | | 8/1999 | Yamaguchi et al. | |
| 6,083,266 | A | * | 7/2000 | Ohtsu et al. ..................... | 703/2 |
| 6,129,459 | A | * | 10/2000 | Kishimoto et al. ............ | 703/5 |
| 6,182,023 | B1 | * | 1/2001 | Ohtsu et al. ..................... | 703/5 |
| 6,285,957 | B1 | * | 9/2001 | Tanaka et al. ................. | 702/57 |
| 6,499,004 | B1 | * | 12/2002 | Ohtsu et al. ..................... | 703/6 |
| 6,604,225 | B1 | * | 8/2003 | Otsu et al. ...................... | 716/3 |

FOREIGN PATENT DOCUMENTS

| JP | 411296500 A | * | 10/1999 | ........... G06F/17/00 |
|---|---|---|---|---|
| JP | 2000155145 A | * | 6/2000 | ........... G01R/29/08 |

OTHER PUBLICATIONS

"Computer Model for the Simulation of Printed Superdirective HTS Spiral Antennas", R.J. Waldron, Computation in Electromagnetics, pp. 332–337, IEE, Apr. 1996.*

* cited by examiner

Primary Examiner—Kevin J. Teska
Assistant Examiner—Fred Ferris
(74) Attorney, Agent, or Firm—Staas & Halsey LLP

(57) ABSTRACT

A simulation device and method to simulate the electric current flowing in electronic devices using the moment method, and to execute accurate simulation processing when the electronic device has an amplifier. An allocating device allocates defining dipoles to the input terminal and output terminal of an amplifier of an electronic device for the purpose of deriving the electric current flowing in the element. A creating device creates a simultaneous equation of the moment method having a form such that the amplifier input impedance is inserted into the input terminal dipole allocated by the allocating device, and the amplifier output impedance, or its inverse, and a dependent energy source responding to the amplification characteristics of the amplifier are inserted into the output terminal dipole allocated by the allocating device. A solving device solves the simultaneous equation of the moment method created by creating device.

36 Claims, 37 Drawing Sheets

```
# AMP-V-V   Vin-CONTROLLED-Vout-TYPE
20
1
11      1  1
        0
        10.0
11      1  1
        0
        50.0
10     100
       100      0.0      40.0
       200      0.0     120.0
       300      0.0     120.0
       400      0.0      40.0
       500      0.0      10.0
       600      0.0       1.0
       700      0.0       1.0
       800      0.0       1.0
       900      0.0       1.0
      1000      0.0       1.0
```

FIG. 5

```
# DAMP-V-V    Dif-Vin-CONTROLLED-Vout-TYPE
20
5
11    1 1
      0
      35.0
11    1 1
      00
      35.0
11    1 1
      00
      50.0
11    1 1
      00
      40.0
10    101
      100    40.0    90.0
      200    120.0   90.0
      300    120.0   90.0
      400    40.0    90.0
      500    10.0    90.0
      600    1.0     90.0
      700    1.0     90.0
      800    1.0     90.0
      900    1.0     90.0
      1000   1.0     90.0
10    101
      100    50.0    0.0
      200    50.0    0.0
      300    50.0    0.0
      400    50.0    0.0
      500    50.0    0.0
      600    50.0    0.0
      700    50.0    0.0
      800    50.0    0.0
      900    50.0    0.0
      1000   50.0    0.0
```

FIG. 6

$$\begin{bmatrix} z_{11} & z_{12} & z_{13} & \cdots & z_{m1} & \cdots & z_{N1} \\ z_{21} & z_{22} & z_{23} & \cdots & z_{m2} & \cdots & z_{N2} \\ z_{31} & z_{32} & z_{33} & \cdots & z_{m3} & \cdots & z_{N3} \\ \vdots & \vdots & \vdots & & \vdots & & \vdots \\ z_{1N} & z_{2N} & z_{3N} & \cdots & z_{mN} & \cdots & z_{NN} \end{bmatrix} \begin{bmatrix} I_1 \\ I_2 \\ I_3 \\ \vdots \\ I_m \\ \vdots \\ I_N \end{bmatrix} = \begin{bmatrix} V_1 \\ V_2 \\ V_3 \\ \vdots \\ V_m \\ \vdots \\ V_N \end{bmatrix}$$

MUTUAL IMPEDANCE — ELECTRIC CURRENT — WAVE SOURCE (N IS THE ELEMENT NUMBER)

FIG. 7

$$Z = j\omega \int_s \left[ \frac{\mu}{4\pi} J1\, J2\, \cos\phi \frac{e^{-jkr}}{r} + \frac{1}{4\pi\varepsilon} \rho_1 \rho_2 \frac{e^{-jkr}}{r} \right] ds$$

FIG. 11A $$Z_{13} = \frac{j\omega\mu}{4\pi \sin k d_1 \sin k d_3} \int_{t_0}^{t_1}\int_{z_0}^{z_1} \left[ \sin k(z-z_0) \sin k(t-t_0) \cos\phi_1 - \cos k(z-z_0) \cos k(t-t_0) \right] \frac{e^{-jkr}}{r} dz\, dt$$

$$Z_{14} = \frac{j\omega\mu}{4\pi \sin k d_1 \sin k d_4} \int_{t_1}^{t_2}\int_{z_0}^{z_1} \left[ \sin k(z-z_0) \sin k(-t+t_2) \cos\phi_2 + \cos k(z-z_0) \cos k(-t+t_2) \right] \frac{e^{-jkr}}{r} dz\, dt$$

FIG. 11B $$\begin{bmatrix} Z_{11} & \cdots & Z_{a1} & Z_{b1} & \cdots & \cdots & Z_{N1} \\ Z_{21} & \cdots & & & & & \\ \vdots & & & & & & \\ & & Z_{aa}+Z_i & & & & \\ & & Z_{ba}-A_v \cdot Z_i & Z_{ab} & & & \\ & & & Z_{bb}+Z_o & & & \\ \vdots & & & & & & \vdots \\ Z_{1N} & \cdots & Z_{aN} & Z_{bN} & \cdots & \cdots & Z_{NN} \end{bmatrix} \begin{bmatrix} I_1 \\ I_2 \\ \vdots \\ I_a \\ I_b \\ \vdots \\ I_N \end{bmatrix} = \begin{bmatrix} 0 \\ 0 \\ \vdots \\ 0 \\ 0 \\ \vdots \\ V_s \\ \vdots \\ 0 \end{bmatrix}$$

FIG. 16

$$\begin{bmatrix} Z_{11} & & \cdots & Z_{a1} & Z_{b1} & \cdots & & Z_{N1} \\ Z_{21} & & \cdots & & & \cdots & & \\ \vdots & & & \vdots & \vdots & & & \vdots \\ & & & Z_{aa}+Z_i & Z_{ab} & & & \\ & & & Z_{ba}-A_i & Z_{bb}+Z_0 & & & \\ \vdots & & & \vdots & \vdots & & & \vdots \\ Z_{1N} & Z_{2N} & \cdots & Z_{aN} & Z_{bN} & \cdots & & Z_{NN} \end{bmatrix} \begin{bmatrix} I_1 \\ I_2 \\ \vdots \\ I_a \\ I_b \\ \vdots \\ I_N \end{bmatrix} = \begin{bmatrix} 0 \\ 0 \\ \vdots \\ 0 \\ 0 \\ \vdots \\ V_s \\ \vdots \\ 0 \end{bmatrix}$$

FIG. 18

$$\begin{bmatrix} Z_{11} & & & & & & & & & Z_{1N} \\ Z_{21} & & & & & & & & & Z_{2N} \\ \vdots & & & & & & & & & \vdots \\ \vdots & & & & & & & & & \vdots \\ Z_{a1} & \cdots & \cdots & Z_{aa}+Z_i & Z_{ab} & \cdots & \cdots & & & Z_{aN} \\ Z_{b1} & \cdots & \cdots & Z_{ba}-A_i \cdot Z_i \cdot Z_0 & Z_{bb}+Z_0 & \cdots & \cdots & & & Z_{bN} \\ \vdots & & & & & & & & & \vdots \\ \vdots & & & & & & & & & \vdots \\ Z_{N1} & & & & & & & & & Z_{NN} \end{bmatrix} \begin{bmatrix} I_1 \\ I_2 \\ \vdots \\ \vdots \\ I_a \\ I_b \\ \vdots \\ \vdots \\ \vdots \\ I_N \end{bmatrix} = \begin{bmatrix} 0 \\ 0 \\ \vdots \\ \vdots \\ 0 \\ 0 \\ \vdots \\ \vdots \\ V_s \\ \vdots \\ 0 \end{bmatrix}$$

FIG. 20

$$\begin{bmatrix} Z_{11} & \cdots & \cdots & Z_{a1} & Z_{b1} & \cdots & \cdots & \cdots & Z_{N1} \\ Z_{21} & \cdots & \cdots & & & \cdots & \cdots & \cdots & \\ \vdots & & & \vdots & \vdots & & & & \vdots \\ \vdots & & & \vdots & \vdots & & & & \vdots \\ & & & Z_{aa}+Z_i & Z_{ab} & & & & \\ & & & Z_{ba}-A_i \cdot Z_o & Z_{bb}+Z_o & & & & \\ \vdots & & & \vdots & \vdots & & & & \vdots \\ \vdots & & & & & & & & \vdots \\ Z_{1N} & \cdots & \cdots & Z_{aN} & Z_{bN} & \cdots & \cdots & \cdots & Z_{NN} \end{bmatrix} \begin{bmatrix} I_1 \\ I_2 \\ \vdots \\ \vdots \\ I_a \\ I_b \\ \vdots \\ \vdots \\ I_N \end{bmatrix} = \begin{bmatrix} 0 \\ 0 \\ \vdots \\ \vdots \\ 0 \\ 0 \\ \vdots \\ V_s \\ 0 \end{bmatrix}$$

FIG. 22

$$\begin{bmatrix} Z_{11} & & & Z_{a1}+Z_{i1} & & & & & Z_{1N} \\ Z_{21} & & & Z_{ba} & & & & & Z_{2N} \\ \vdots & & & Z_{ca}-A_v \cdot Z_{i1} & & & & & \vdots \\ \vdots & & & & Z_{ab} & & & & \vdots \\ Z_{a1} & & & & Z_{bb}+Z_{i2} & & & & Z_{aN} \\ Z_{b1} & & & & Z_{cb}+A_v \cdot Z_{i2} & & & & Z_{bN} \\ Z_{c1} & & & & & Z_{cc}+Z_o & & & Z_{cN} \\ \vdots & & & & & & & & \vdots \\ Z_{N1} & & & & & & & & Z_{NN} \end{bmatrix} \begin{bmatrix} I_1 \\ I_2 \\ \vdots \\ \vdots \\ I_a \\ I_b \\ I_c \\ \vdots \\ \vdots \\ \vdots \\ I_N \end{bmatrix} = \begin{bmatrix} 0 \\ 0 \\ \vdots \\ \vdots \\ 0 \\ 0 \\ 0 \\ \vdots \\ \vdots \\ V_s \\ \vdots \\ 0 \end{bmatrix}$$

FIG. 24

$$\begin{bmatrix} Z_{11} & & \cdots & & Z_{a1} & Z_{b1} & Z_{c1} & \cdots & \cdots & \cdots & Z_{N1} \\ Z_{21} & & \cdots & & & & & & & & \\ \vdots & & & & & & & & & & \\ \vdots & & & & & & & & & & \\ & & & & Z_{aa}+Z_{i1} & Z_{ab} & & & & & \\ & & & & Z_{ba} & Z_{bb}+Z_{i2} & & & & & \\ & & & & Z_{ca}-A_i & Z_{cb}+A_i & Z_{cc}+Z_0 & & & & \\ \vdots & & & & & & & & & & \\ \vdots & & & & & & & & & & \\ Z_{1N} & & \cdots & & Z_{aN} & Z_{bN} & Z_{cN} & \cdots & \cdots & \cdots & Z_{NN} \end{bmatrix} \begin{bmatrix} I_1 \\ I_2 \\ \vdots \\ \vdots \\ I_a \\ I_b \\ I_c \\ \vdots \\ \vdots \\ \vdots \\ I_N \end{bmatrix} = \begin{bmatrix} 0 \\ 0 \\ \vdots \\ \vdots \\ 0 \\ 0 \\ 0 \\ \vdots \\ \vdots \\ V_s \\ \vdots \\ 0 \end{bmatrix}$$

FIG. 26

$$\begin{bmatrix} Z_{11} & \cdots & Z_{a1}+Z_{i1} & Z_{ba} & Z_{ca}-A_i \cdot Z_{i1} \cdot Z_0 & \cdots & Z_{1N} \\ Z_{21} & \cdots & & Z_{ab} & & \cdots & Z_{2N} \\ \vdots & & & Z_{bb}+A_i \cdot Z_{i2} \cdot Z_0 & & & \vdots \\ Z_{a1} & & & Z_{cb} & Z_{cc}+Z_0 & & Z_{aN} \\ Z_{b1} & & & & & & Z_{bN} \\ Z_{c1} & & & & & & Z_{cN} \\ \vdots & & & & & & \vdots \\ Z_{N1} & \cdots & & & & \cdots & Z_{NN} \end{bmatrix} \begin{bmatrix} I_1 \\ I_2 \\ \vdots \\ I_a \\ I_b \\ I_c \\ \vdots \\ I_N \end{bmatrix} = \begin{bmatrix} 0 \\ 0 \\ \vdots \\ 0 \\ 0 \\ 0 \\ \vdots \\ V_s \\ \vdots \\ 0 \end{bmatrix}$$

FIG. 28

$$\begin{bmatrix} Z_{11} & Z_{21} & \cdots & \cdots & Z_{a1} & Z_{b1} & Z_{c1} & \cdots & \cdots & \cdots & Z_{N1} \\ \vdots & & & & \vdots & \vdots & \vdots & & & & \vdots \\ & & & & Z_{aa}+Z_{i1} & Z_{ba} & Z_{ca}-A_i \cdot Z_0 & & & & \\ & & & & Z_{ab} & Z_{bb}+Z_{i2} & Z_{cb}+A_i \cdot Z_0 & & & & \\ & & & & & & Z_{cc}+Z_0 & & & & \\ \vdots & & & & \vdots & \vdots & \vdots & & & & \vdots \\ Z_{1N} & Z_{2N} & \cdots & \cdots & Z_{aN} & Z_{bN} & Z_{cN} & \cdots & \cdots & \cdots & Z_{NN} \end{bmatrix} \begin{bmatrix} I_1 \\ I_2 \\ \vdots \\ \vdots \\ I_a \\ I_b \\ I_c \\ \vdots \\ \vdots \\ \vdots \\ I_N \end{bmatrix} = \begin{bmatrix} 0 \\ 0 \\ \vdots \\ \vdots \\ 0 \\ 0 \\ 0 \\ \vdots \\ \vdots \\ V_s \\ 0 \end{bmatrix}$$

FIG. 30

$$\begin{bmatrix} Z_{11} & Z_{21} & \cdots & \cdots & Z_{a1} & Z_{b1} & Z_{c1} & \cdots & \cdots & \cdots & Z_{N1} \\ & & & & Z_{aa}+Z_i & Z_{ab}+Z_0 & Z_{ac} & & & & \\ \vdots & \vdots & \vdots & \vdots & Z_{ba}-A_V \cdot Z_i & Z_{bb}+Z_0 & Z_{bc}-A_M \cdot R_M & \vdots & \vdots & \vdots & \vdots \\ & & & & Z_{ca} & Z_{cb} & Z_{cc}+R_M & & & & \\ Z_{1N} & Z_{2N} & \cdots & \cdots & Z_{aN} & Z_{bN} & Z_{cN} & \cdots & \cdots & \cdots & Z_{NN} \end{bmatrix} \begin{bmatrix} I_1 \\ I_2 \\ \vdots \\ \vdots \\ I_a \\ I_b \\ I_c \\ \vdots \\ \vdots \\ \vdots \\ I_N \end{bmatrix} = \begin{bmatrix} 0 \\ 0 \\ \vdots \\ \vdots \\ 0 \\ 0 \\ 0 \\ \vdots \\ \vdots \\ V_s \\ \vdots \\ 0 \end{bmatrix}$$

FIG. 32

$$\begin{bmatrix} Z_{11} & \cdots & Z_{aa}+Z_i & Z_{ab}+Z_0 & Z_{ac}-A_M & Z_{ad}+A_M & \cdots & Z_{1N} \\ Z_{21} & \cdots & Z_{ba}-A_V \cdot Z_i & Z_{bb}+Z_0 & Z_{bc}-A_M & Z_{bd}+A_M & \cdots & Z_{2N} \\ \vdots & & Z_{ca} & Z_{cb} & Z_{cc} & Z_{cd} & & \vdots \\ \vdots & & Z_{da} & Z_{db} & Z_{dc} & Z_{dd} & & \vdots \\ Z_{a1} & & & & & & & Z_{aN} \\ Z_{b1} & & & & & & & Z_{bN} \\ Z_{c1} & & & & & & & Z_{cN} \\ Z_{d1} & & & & & & & Z_{dN} \\ \vdots & & & & & & & \vdots \\ Z_{N1} & \cdots & & & & & \cdots & Z_{NN} \end{bmatrix} \begin{bmatrix} I_1 \\ I_2 \\ \vdots \\ I_a \\ I_b \\ I_c \\ I_d \\ \vdots \\ I_N \end{bmatrix} = \begin{bmatrix} 0 \\ 0 \\ \vdots \\ 0 \\ 0 \\ 0 \\ 0 \\ \vdots \\ V_s \\ \vdots \\ 0 \end{bmatrix}$$

FIG. 34

SIMULATION DEVICE AND METHOD AND PROGRAM RECORDING MEDIUM

CROSS-REFERENCE TO RELATED APPLICATIONS

This application is based upon and claims priority of Japanese Patent Application No. 11-018284 filed Jan. 27, 1999, the contents being incorporated herein by reference.

BACKGROUND OF THE INVENTION

1. Field of the Invention

The present invention relates to a simulation device and method of simulating the current flowing in an electronic device using a moment method. More particularly, the present invention relates to a simulation device and method for performing accurate simulation of an electronic device having an amplifier, and a computer readable storage medium encoded with processing instructions for implementing a simulation method to simulate the current flowing in an electronic device.

2. Description of the Related Art

Society has demanded that the radiation of radio waves and noise by electronic devices not be above a certain level, and countries throughout the world have regulations strictly controlling the levels of radio waves and noise. A variety of technologies are employed to comply with the various types of regulations concerning the level of radio waves, such as shield technology and filter technology. To quantitatively calculate the degree to which these technologies reduce the level of radio waves, the development of simulation technology is necessary.

Furthermore, society has demanded that electronic devices not be affected by radio waves radiated by other electronic devices and which are below a certain level, and countries throughout the world have regulations strictly controlling these levels. To comply with these regulations concerning radio waves, it is checked whether electronic devices are affected by the radio waves radiated by antennas. Therefore, what is needed to satisfy the various regulations is simulation technology to simulate the effect of radio waves radiated by antennas on electronic devices.

In order for the simulation technology to be practical, it is necessary to provide technology that performs accurate simulation processing. In view of the need for accurate simulation technology, the present inventors have disclosed simulation technology which uses the moment method to simulate the current flowing in electronic devices.

The electrical and magnetic currents flowing in electronic devices can, theoretically, be obtained by solving Maxwell's electromagnetic wave equations under given boundary conditions. The moment method is one method of solving integral equations derived from Maxwell's electromagnetic wave equations. More particularly, the moment method is a method of performing calculations of electrical and magnetic current by partitioning a body into small elements, and can be applied to three-dimensional bodies of any shape. The moment method is disclosed, for example, by H. N. Wang, J. H. Richmond and M. C. Gilreath, "Sinusoidal Reaction Formulation for Radiation and Scattering From Conducting Surface," IEEE Transactions Antennas Propagation, vol. AP-23, 1975.

The moment method translates the structure of the electronic device to be simulated into a mesh and selects the frequency to be processed. The frequency to be processed is found by performing a predetermined calculation on the mutual impedance, mutual admittance and mutual reactance between the elements that have been translated into the mesh. By substituting the mutual impedance, mutual admittance and mutual reactance thus found and the wave source designated by the structural information into the simultaneous equation of the moment method and solving the equation, the electrical current and magnetic current flowing in each element can be found.

In other words, when a metallic object is concerned, the metallic portions are translated into a mesh in order to perform analysis. Mutual impedance $Z_{ij}$ between the meshed metallic elements (the value at the processing frequency) is found, and by solving the following simultaneous equation of the moment method formed between the mutual impedance $Z_{ij}$, the frequency component wave source $V_i$ and current $I_i$ flowing in the meshed metallic elements is determined.

$[Z_{ij}][I_i]=[V_i]$, with [ ] being a matrix

The intensity of the electromagnetic field being radiated by an electronic device is calculated from the result of the above equation.

Mutual impedance displays the relationship between the electrical field caused by the electric current of one element and the electric current of other elements. Mutual admittance, which is necessary when considering the presence of a dielectric substance, displays the relationship between the magnetic field caused by the magnetic current of one element with the magnetic current of other elements. Mutual reactance, which is necessary when considering the presence of a dielectric substance, displays the relationship between the electric field (or magnetic field) caused by the electric current (or magnetic current) of one element and the electric current (or magnetic current) of other elements. As described herein, electric currents flow in metals, and electric currents and magnetic currents flow on the surface of dielectric substances.

When using the moment method to simulate the electric current and magnetic current flowing in an electronic device with the conventional technology, if the electronic device has an amplifier, the electric current and magnetic current flowing in the electronic device are simulated by hypothesizing a wave source that generates a voltage equivalent to the voltage input into the amplifier at the amplifier's input terminal, and by hypothesizing a wave source that generates a voltage equivalent to the voltage output by the amplifier at the amplifier's output terminal.

However, when using the conventional technology, there is a problem of not being able to accurately simulate the electric current and magnetic current flowing in an electronic device. In particular, the voltage and current input into an amplifier will vary depending on radio waves from external sources and radio waves from the other circuit elements in the electronic device, and the voltage and current output by the amplifier will vary according to the input voltage and current as affected by the radio waves from external sources and internal circuit elements. The conventional technology does not use a model which takes into account radio waves from external sources and radio waves from other circuit elements, resulting in the problem of not being able to accurately simulate the electric current and magnetic current flowing in an electronic device.

Furthermore, with the conventional simulation technology, when the electronic device to be simulated has an amplifier, a model of an amplifier is made with two wave sources independent of each other (i.e., a wave source disposed on the input terminal of the amplifier and a wave source disposed on the output terminal of the amplifier). Moreover, even if the voltage and current input at the amplifier vary because of the radio waves from an external source or the radio waves from the other circuit elements of the electronic device, the voltage and current output from the amplifier will not vary. Thus, an accurate simulation of the electric current and magnetic current flowing in an electronic device cannot be made.

SUMMARY OF THE INVENTION

It is an object of the present invention to overcome the disadvantages of the conventional simulation method and device for simulating current flowing in an electronic device and to provide a simulation method and device for performing accurate simulation when the moment method is used to simulate the electric current flowing in an electronic device having an amplifier.

It is another object of the present invention to provide a computer readable storage medium encoded with processing instructions for implementing a simulation method to simulate the current flowing in an electronic device.

Objects and advantages of the present invention are achieved in accordance with embodiments of the present invention with a simulation device to simulate current flowing in an electronic device by solving a simultaneous equation of the moment method derived by partitioning the electronic device into elements, the electronic device including an amplifier having an input terminal and an output terminal, comprising allocating means for allocating respective dipoles to the input terminal and the output terminal to derive the current flowing in the elements; creating means for creating a simultaneous equation of the moment method having a form such that an input impedance of the amplifier is inserted at the input terminal dipole allocated by the allocating means, and one of an output impedance of the amplifier or an inverse of the output impedance of the amplifier, and a dependent voltage source corresponding to amplifying characteristics of the amplifier, are inserted at the output terminal dipole allocated by the allocating means; and solution means for solving the simultaneous equation of the moment method created by the creating means.

In accordance with embodiments of the present invention, the amplifier includes a plurality of input terminals, and the allocating means allocates dipoles to the input terminals in a form corresponding to the amplifying characteristics of the amplifier.

In accordance with embodiments of the present invention, the amplifier is a voltage amplifier, and the creating means creates a simultaneous equation of the moment method having a form such that the output impedance of the amplifier is inserted at the output terminal dipole.

In accordance with embodiments of the present invention, the amplifier is a current amplifier, and the creating means creates a simultaneous equation of the moment method having a form such that the inverse of output impedance of the amplifier is inserted at the output terminal dipole.

In accordance with embodiments of the present invention, the output voltage of the amplifier is dependent upon the input voltage, and the creating means creates a simultaneous equation of the moment method having a form such that the dependent voltage source inserted at the output terminal dipole generates a voltage corresponding to a product of the input impedance of the amplifier, an amplification rate of the amplifier, and a current flowing in the dipole of the input terminal.

In accordance with embodiments of the present invention, the output voltage of the amplifier is dependent upon the input current, and the creating means creates a simultaneous equation of the moment method having a form such that the dependent voltage source inserted at the output terminal dipole generates a voltage corresponding to a product of an amplification rate of the amplifier and a current flowing in the dipole of the input terminal.

In accordance with embodiments of the present invention, the output current of the amplifier is dependent upon the input voltage, and the creating means creates a simultaneous equation of the moment method having a form such that the dependent voltage source inserted at the output terminal dipole generates a voltage corresponding to a product of the input impedance of the amplifier, the output impedance of the amplifier, an amplification rate of the amplifier and a current flowing in the dipole of the input terminal.

In accordance with embodiments of the present invention, the output current of the amplifier is dependent upon the input current, and the creating means creates a simultaneous equation of the moment method having a form such that the dependent voltage source inserted at the output terminal dipole generates a voltage corresponding to a product of the output impedance of the amplifier, an amplification rate of the amplifier and a current flowing in the input terminal dipole.

In accordance with embodiments of the present invention, the allocating means allocates a dipole between a source terminal of the amplifier and a ground terminal, and the creating means creates a simultaneous equation of the moment method having a form such that an impedance for observation corresponding to the impedance between the source terminal and the ground terminal is inserted at the dipole allocated between the source terminal and the ground terminal, and the dependent voltage source inserted at the output terminal dipole generates a voltage corresponding to a product of a value indicating the effect of a voltage between the source terminal and the ground terminal, the impedance for observation and current flowing in the dipole allocated between the source terminal and the ground terminal.

In accordance with embodiments of the present invention, the allocating means allocates a dipole between two points, and the creating means creates a simultaneous equation of the moment method having a form such that an impedance for observation corresponding to the impedance between the two points is inserted at the dipole allocated between the two points, and the dependent voltage source inserted at the output terminal dipole generates a voltage corresponding to a product of a value indicating the effect of a source voltage, the impedance for observation and current flowing in the dipole allocated between the two points.

In accordance with embodiments of the present invention, the allocating means allocates a dipole between two points, and the creating means creates a simultaneous equation of the moment method having a form such that the dependent voltage source inserted at the dipole of the output terminal generates a voltage corresponding to a product of a value indicating the effect of a current flowing between the two points and a current flowing in the dipole allocated between the two points.

Objects and advantages of the present invention are achieved in accordance with embodiments of the present invention with a simulation method to simulate current flowing in an electronic device including an amplifier having an input terminal and an output terminal by solving simultaneous equations of the moment method derived by partitioning the electronic device into elements, comprising allocating to the input terminal and output terminal of the amplifier respective dipoles to derive the current flowing in the elements; creating a simultaneous equation of the moment method having a form such that an input impedance of the amplifier is inserted at the input terminal dipole allocated to the input terminal, and one of an output impedance of the amplifier or an inverse of the output impedance of the amplifier, and a dependent voltage source corresponding to amplifying characteristics of the amplifier, are inserted at the output terminal dipole allocated to the output terminal; and solving the created simultaneous equation of the moment method.

Objects and advantages of the present invention are achieved in accordance with embodiments of the present invention with a computer readable medium encoded with processing instructions for implementing a simulation method to simulate the current flowing in an electronic device by solving a simultaneous equation of the moment method derived by partitioning the electronic device into elements, the electronic device including an amplifier having an input terminal and an output terminal, the simulation method comprising allocating to the input terminal and output terminal of the amplifier respective dipoles to derive the current flowing in the elements; creating a simultaneous equation of the moment method having a form such that an input impedance of the amplifier is inserted at the input terminal dipole allocated to the input terminal, and one of an output impedance of the amplifier or an inverse of the output impedance of the amplifier, and a dependent voltage source corresponding to amplifying characteristics of the amplifier, are inserted at the output terminal dipole allocated to the output terminal; and solving the created simultaneous equation of the moment method.

BRIEF DESCRIPTION OF THE DRAWINGS

These and other objects and advantages of the invention will become apparent and more readily appreciated from the following description of the preferred embodiments, taken in conjunction with the accompanying drawings of which:

FIG. 5 and is a diagram of an amplifier library in accordance with embodiments of the present invention.

FIG. 6 is a diagram of an amplifier library in accordance with embodiments of the present invention.

FIG. 7 is a diagram of a simultaneous equation of the moment method in accordance with embodiments of the present invention.

FIGS. 11A and 11B are diagrams of a method for computing mutual impedance in accordance with embodiments of the present invention.

FIG. 16 is a diagram of a simultaneous equation of the moment method in accordance with the embodiments of the present invention.

FIG. 18 is a diagram of a simultaneous equation of the moment method in accordance with the embodiments of the present invention.

FIG. 20 is a diagram of a simultaneous equation of the moment method in accordance with the embodiments of the present invention.

FIG. 22 is a diagram of a simultaneous equation of the moment method in accordance with the embodiments of the present invention.

FIG. 24 is a diagram of a simultaneous equation of the moment method in accordance with the embodiments of the present invention.

FIG. 26 is a diagram of a simultaneous equation of the moment method in accordance with the embodiments of the present invention.

FIG. 28 is a diagram of a simultaneous equation of the moment method in accordance with the embodiments of the present invention.

FIG. 30 is a diagram of a simultaneous equation of the moment method in accordance with the embodiments of the present invention.

FIG. 32 is a diagram of a simultaneous equation of the moment method in accordance with the embodiments of the present invention.

FIG. 34 is a diagram of a simultaneous equation of the moment method in accordance with the embodiments of the present invention.

DESCRIPTION OF THE PREFERRED EMBODIMENTS

Figure 1:
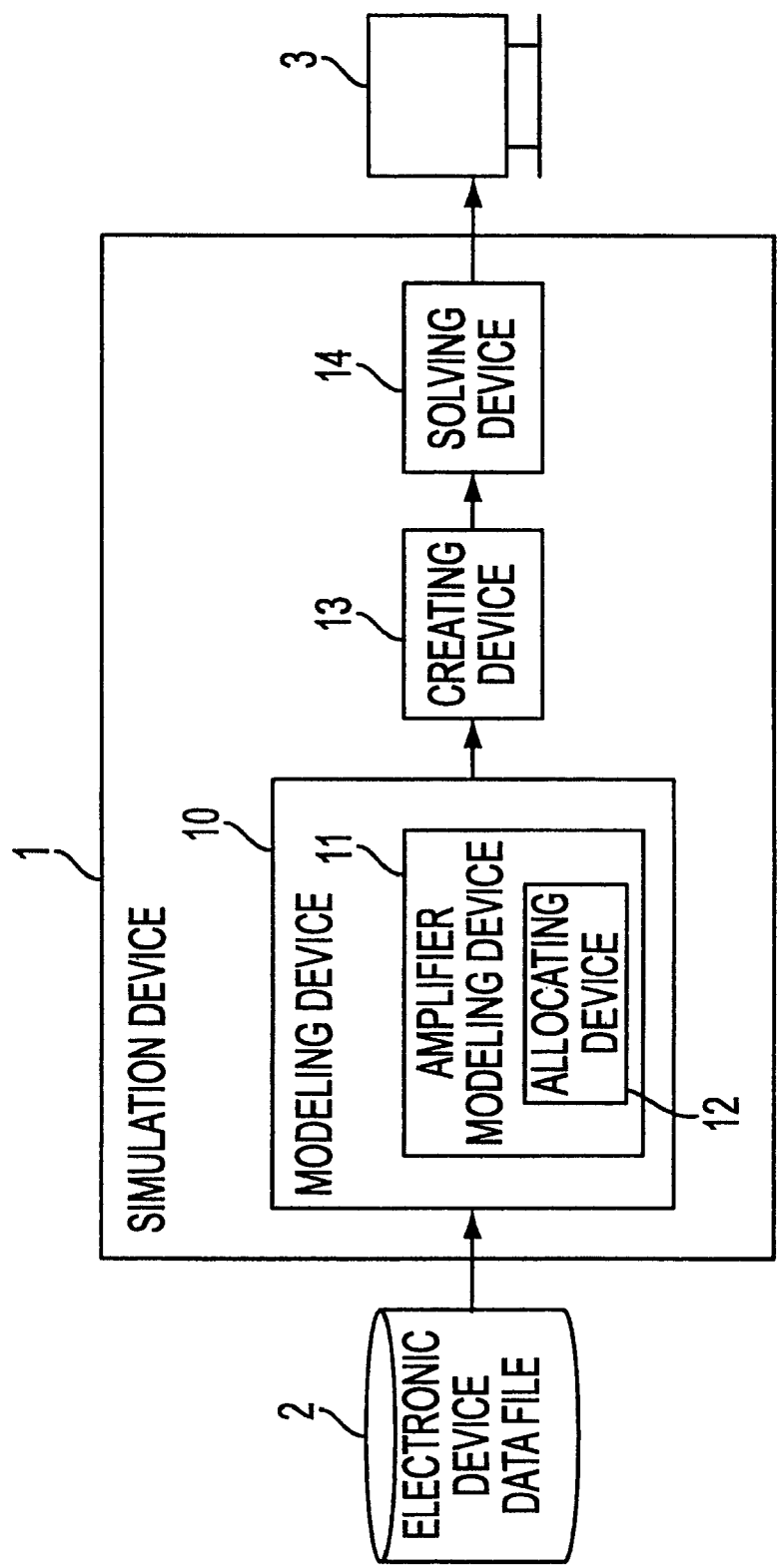
FIG. 1 is a block diagram of a simulation device in accordance with embodiments of the present invention.

Reference will now be made in detail to the preferred embodiments of the present invention, examples of which are illustrated in the accompanying drawings, wherein like reference numerals refer to like elements throughout.

FIG. 1 is a block diagram of a simulation device 1 in accordance with embodiments of the present invention. As shown in FIG. 1, the simulation device 1 reads structured information concerning the electronic device to be simulated from an electronic device data file 2. The simulation device 1 simulates the electric current flowing in the electronic device using the moment method and outputs the result to a simulation output device 3.

The simulation device 1 in accordance with the present invention comprises a modeling device 10, an amplifier modeling device 11, an allocating device 12, a creating device 13, and a solving device 14.

The modeling device 10 partitions the electronic device read from the electronic device data file 2 into elements. A simulation model is created by allocating dipoles to pairs of elements that will be the allocation units for the electric current functions.

The amplifier modeling device 11 includes the allocating device 12 which, expanded by the modeling device 10, allocates dipoles to the input and output terminals, respectively, of the amplifier of the electronic device, thus creating the basic simulation model of the amplifier.

The creating device 13 creates a simultaneous equation of the moment method such that the amplifier input impedance is inserted at the dipole of the amplifier input terminal allocated by the allocating device 12, and the amplifier output impedance or its inverse, as well as the dependent voltage source corresponding to the amplifying characteristics of the amplifier, are inserted at the dipole of the amplifier output terminal allocated by the allocating device 12.

By solving the simultaneous equation of the moment method created by the creating device 13, the solving device 14 calculates the electric current flowing in the electronic device and outputs the calculated electric current to the simulation output device 3.

In accordance with preferred embodiments of the present invention, the simulation device 1 includes a computer readable storage medium, such as a floppy disk or hard disk, to store processing instructions for implementing a simulation method to simulate the current flowing in an electronic device. The processing instructions may be stored on floppy diskettes and the like, or may be stored on the disks of servers and the like, and then installed in the simulation device 1 and operated using memory.

In operation of the simulation device 1 in accordance with embodiments of the present invention, firstly, the creating device 13 completes a simultaneous equation of the moment method such that the amplifier input impedance is inserted at the dipole of the amplifier input terminal allocated by the allocating device 12, and the amplifier output impedance or its inverse, as well as the dependent voltage source corresponding to the amplifying characteristics of the amplifier, are inserted at the dipole of the amplifier output terminal allocated by the allocating device 12. Next, using the dipoles allocated by the modeling device 10 (or allocating device 12), the mutual impedance between the elements and the like is calculated, and the simultaneous equation of the moment method is created.

Alternatively, first using the dipoles allocated by the modeling device 10 (or the allocating device 12), the mutual impedance between the elements and the like is calculated. Next, the simultaneous equation of the moment method is created by adding changes to the mutual impedance and the like, such that the insertion of the input impedance/output impedance/dependent voltage source is performed.

In the above-described manner, the creating device 13 creates a simultaneous equation of the moment method such that the amplifier input impedance is inserted at the dipole of the amplifier input terminal allocated by the allocating device 12, and the output impedance of the amplifier or its inverse, as well as the dependent voltage source corresponding to the amplifying characteristics of the amplifier, is inserted at the dipole of the amplifier output terminal allocated by the allocating device 12.

At this time, when the amplifier is a voltage amplifier, the creating device 13 creates a simultaneous equation of the moment method with a form such that the output impedance of the amplifier is inserted at the output terminal dipole.

When the amplifier is a current amplifier, the creating device 13 creates a simultaneous equation of the moment method with a form such that the inverse of the output impedance of the amplifier is inserted at the output terminal dipole.

When the output voltage of the amplifier is dependent upon the input voltage, the creating device 13 creates a simultaneous equation of the moment method with a form such that the dependent voltage source inserted at the dipole of the output terminal generates a voltage corresponding to the product of the input impedance of the amplifier, the amplification rate of the amplifier, and the current flowing in the dipole of the input terminal.

When the output voltage of the amplifier is dependent upon the input current, the creating device 13 creates a simultaneous equation of the moment method with a form such that the dependent voltage source inserted at the dipole of the output terminal generates a voltage corresponding to the product of the amplification rate of the amplifier and the current flowing in the dipole of the input terminal.

When the output current of the amplifier is dependent upon the input voltage, the creating device 13 creates a simultaneous equation of the moment method with a form such that the dependent voltage source inserted at the dipole of the output terminal generates a voltage corresponding to the product of the input impedance of the amplifier, the output impedance of the amplifier, the amplification rate of the amplifier and the current flowing in the dipole of the input terminal.

When the output current of the amplifier is dependent upon the input current, the creating device 13 creates a simultaneous equation of the moment method with a form such that the dependent voltage source inserted at the output terminal dipole generates a voltage corresponding to the product of the output impedance of the amplifier, the amplification rate of the amplifier and the current flowing in the dipole of the input terminal.

In accordance with the embodiment of the invention shown in FIG. 1, when it is necessary to simulate the effect that the voltage between any two points has on the amplifier output, the allocating device 12 allocates a dipole between those two points. In response to allocating a dipole between these two points, the creating device 13 creates a simultaneous equation of the moment method with a form such that an impedance for observation made to correspond to the impedance between those two points is inserted at the dipole thus allocated, and the dependent voltage source inserted at the output terminal dipole generates a voltage corresponding to the product of the value indicating the effect of the voltage between those two points, the impedance for observation and the current flowing in the dipole thus allocated.

Furthermore, when it is necessary to simulate the effect that the current between any two points has on the amplifier output, the allocating device 12 allocates dipoles between those two points. In response to this, the creating device 13 creates a simultaneous equation of the moment method with a form such that the dependent voltage source inserted at the output terminal dipole generates a voltage corresponding to the product of the value indicating the effect of the current between those two points and the current flowing in the dipoles thus allocated.

In the above-described manner, when using the moment method to simulate the current flowing in an electronic device, if the electronic device has an amplifier, an accurate simulation model is created by providing at the amplifier output a dependent voltage source that generates voltage and current dependent on the amplifier's input voltage and input current. By employing a configuration that executes simulation processing in accordance with the above-described model, the simulation device 1 of the present invention executes an accurate simulation when an electronic device has an amplifier.

Figure 2:
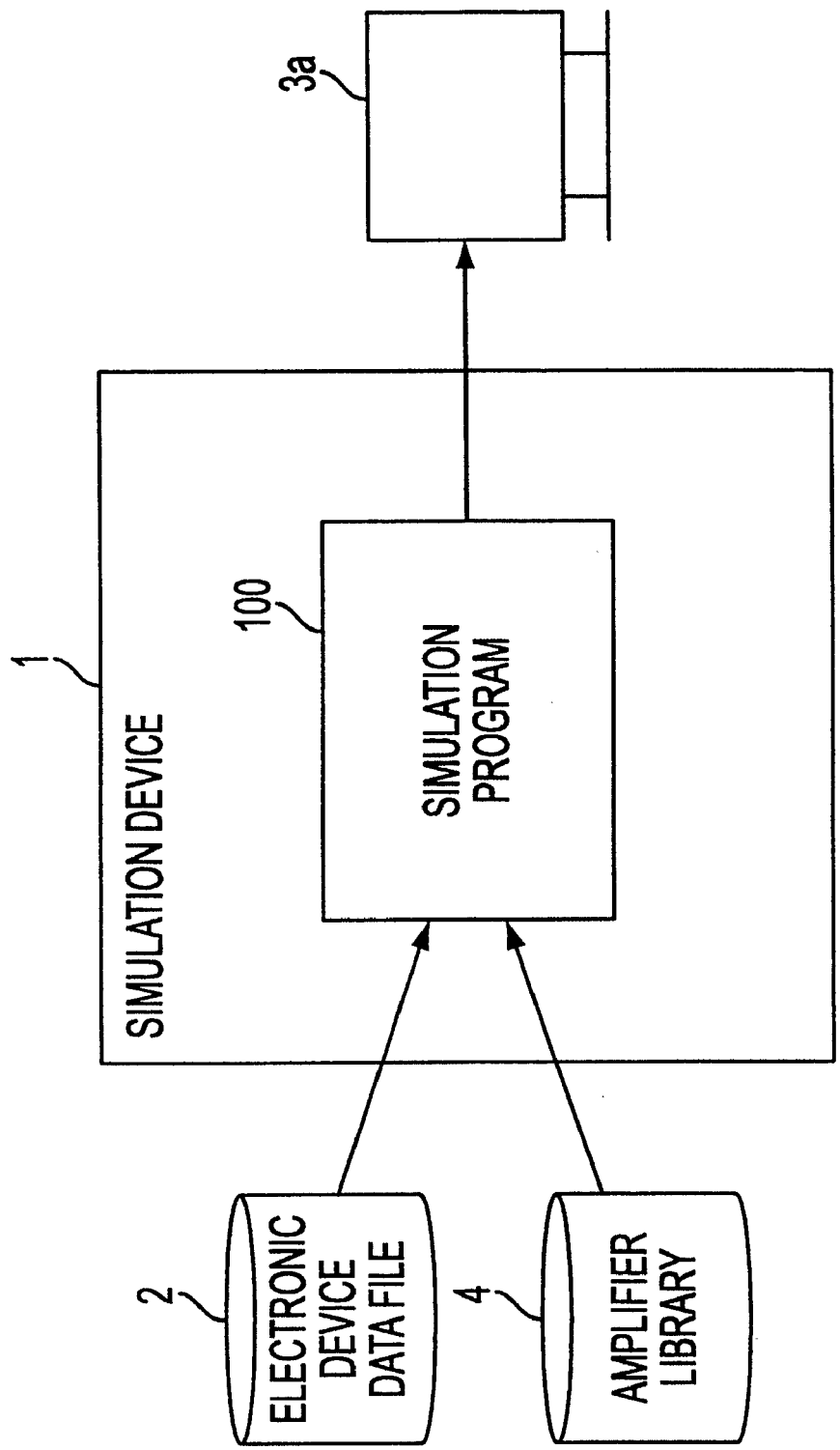
FIG. 2 is a block diagram of a simulation device in accordance with embodiments of the present invention.

FIG. 2 is a block diagram of a simulation device 1 in accordance with embodiments of the present invention.

As shown in FIG. 2, the simulation device 1 in accordance with embodiments of the present invention comprises an electronic device data file 2 to store the structural information of the electronic device to be simulated, an amplifier library 4 to store the amplifier data of the electronic device to be simulated, a display device 3a to display the simulation results, and a simulation program 100 that is installed via a floppy disk, circuit or the like, and uses the moment method to simulate the current flowing in the electronic device to be simulated, and pursuant to that calculates the intensity of the electromagnetic field radiated by the electronic device.

Figure 3:
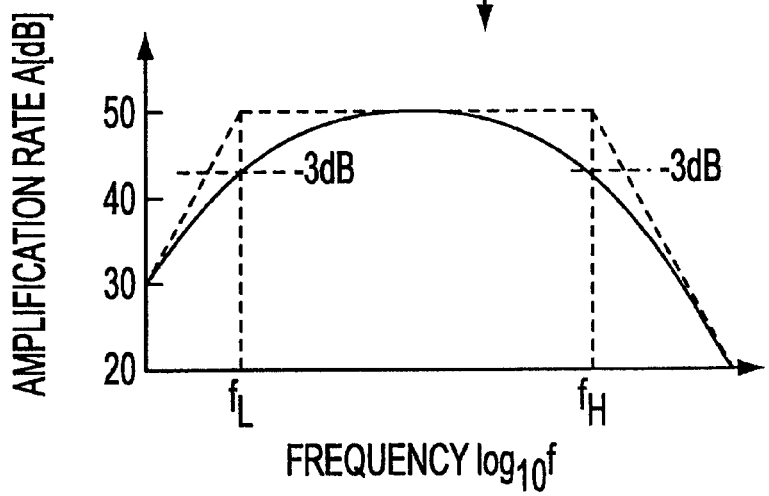
FIG. 3 is a diagram of the data structure of the amplifier library in accordance with embodiments of the present invention.

FIG. 3 is a diagram illustrating an example of the data configuration of the amplifier library 4 in accordance with embodiments of the present invention.

As shown in FIG. 3, the amplifier library 4 manages the amplifier data using the following data items: library name, comments, library category, amplifier category, the amplifier input unit circuit form, the amplifier output unit circuit form, and the amplifier amplification rate table (table number and table form are defined).

Figure 4A:
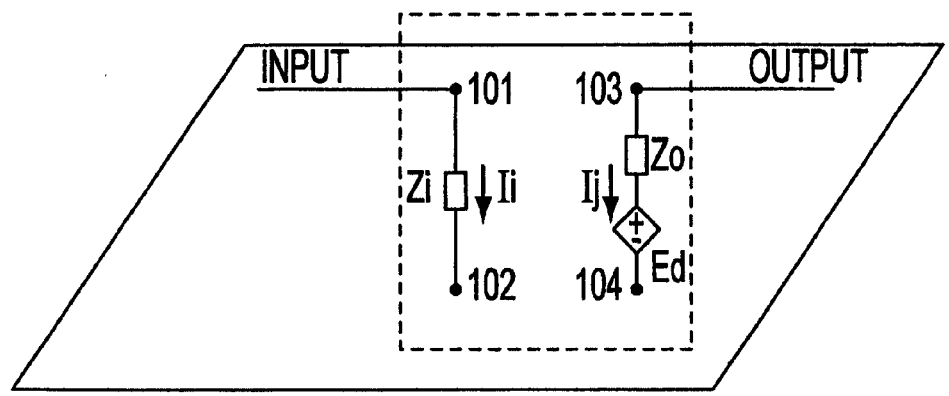
FIGS. 4A and 4B are diagrams of an amplifier in accordance with embodiments of the present invention.

For example, if the amplifier of the electronic device to be simulated has a circuit configuration as shown in FIG. 4A, the amplifier library 4 manages the data relating to the amplifier in the manner shown in FIG. 5.

More specifically, as shown in FIG. 5, management is performed such that for amplification rates between 100 MHz and 1000 MHz, the following values are stored: the library name where the amplifier data is stored is "# AMP-V-V"; the library category is "20" (indicating the amplifier library); the amplifier category is "1" (indicating that the amplifier is a voltage input/voltage output type amplifier); the input unit circuit form is "11" (indicating that it is a series connection input unit circuit form); the table number describing the characteristics of the circuit element of the input unit is "1"; the circuit element is "1" (indicating that it is resistance); the frequency characteristic of the circuit element is "0" (indicating that it is not dependent upon the frequency); the resistance value of the circuit element is "10.0 MΩ"; the output unit circuit form is "11" (indicating that it is a series connection output unit circuit form); the table number describing the characteristics of the circuit element that makes up the output unit is "1"; the circuit element is "1" (indicating that it is resistance); the frequency characteristic of the circuit element is "0" (indicating that it is not dependent upon the frequency); the resistance value of the circuit element is "50.0 MΩ"; the amplification ratios of the amplifier are defined by "10" tables, and the amplification ratios descriptions are "100" (indicating that they are real/imaginary numbers).

In accordance with the embodiment shown in FIG. 5, when the amplifier of an electronic device to be simulated has a circuit configuration as shown in FIG. 4A, the amplifier data read from the electronic device data file 2 is described in the following manner:

"$ AMP 1 1 101 102 103 104 #AMP-V-V amplib.prv"

The amplifier data indicates that for the amplifier with sequence number 1, the amplifier category is "1" (indicating that it is a voltage input/voltage output type amplifier); the position of the input terminal (+) is defined by 101; the position of the input terminal (−) is defined by 102; the position of the output terminal (+) is defined by 103; the position of the output terminal (−) is defined by 104; the library name where the amplifier data is stored is "# AMP-V-V"; and the library name of the library is "amplib.prv."

Figure 4B:
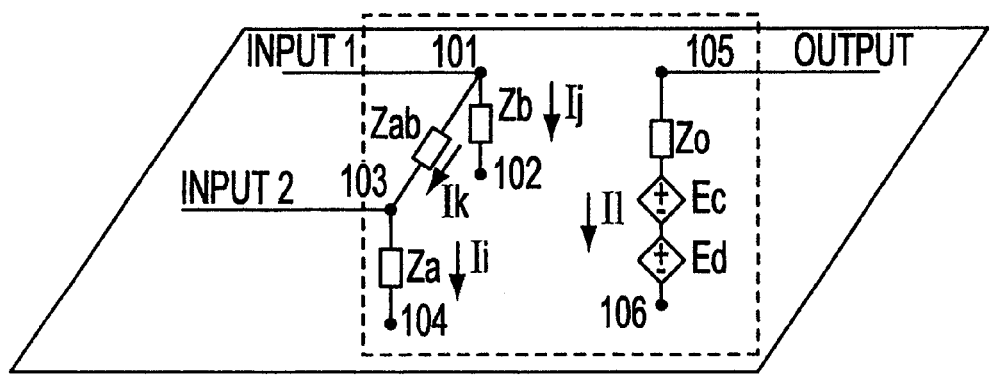

If the amplifier of the electronic device to be simulated has a circuit configuration as shown in FIG. 4B, the amplifier library 4 manages the data relating to the amplifier in the manner shown in FIG. 6.

More specifically, management is performed such that for amplification rates between 100 MHz and 1000 MHz, the following values are stored: the library name where the amplifier data is stored is "# DAMP-V-V"; the library category is "20" (indicating that the amplifier is an amplifier library); the amplifier category is "5" (indicating that it is a voltage input/voltage output type amplifier); the input unit circuit form of input 1 is "11" (indicating that it is a series connection input unit circuit form); the table number describing the characteristics of the circuit element of the input unit is "1"; the circuit element is "1" (indicating that it is resistance); the frequency characteristic of the circuit element is "00" (indicating that it is not dependent upon the frequency); the resistance value of the circuit element is "35.0 MΩ"; the input unit circuit form of input 2 is "11" (indicating that it is a series connection input unit circuit form); the table number describing the characteristics of the circuit element of the input unit is "1"; the circuit element is "1" (indicating that it is resistance); the frequency characteristic of the circuit element is "00" (indicating that it is not dependent upon the frequency); the resistance value of the circuit element is "35.0 MΩ"; the input unit circuit form between input 1 and input 2 is "11" (indicating that it is a series connection input unit circuit form); the table number describing the characteristics of the circuit element of the input unit is "1"; the circuit element is "1" (indicating that it is resistance); the frequency characteristic of the circuit element is "00" (indicating that it is not dependent upon the frequency); the resistance value of the circuit element is "50.0 MΩ"; the output unit circuit form is "11" (indicating that it is a series connection input [output?] unit circuit form); the table number describing the characteristics of the circuit element that makes up the output unit is "1"; the circuit element is "1" (indicating that it is resistance); the frequency characteristic of the circuit element is "00" (indicating that it is not dependent upon the frequency); the resistance value of the circuit element is "40.0 MΩ"; the amplification ratio of the amplifier is defined by "10" tables, and the amplification ratio description is "101" (indicating that it is an absolute value/phase form); and management is performed such that for the command division ratios from 100 MHz to 1000 MHz, the command division ratio of the amplifier is defined by "10" tables, and the command division ratio is defined by "101" (indicating that it is an absolute value/phase form).

In accordance with the embodiment shown in FIG. 6, when the amplifier of an electronic device to be simulated has a circuit configuration as shown in FIG. 4B, the amplifier data read from the electronic device data file 2 is described in the following manner:

"$ AMP
   1 5 101 102 102 103 104 105 106
    #DAMP-V-V amplib.prv"

The amplifier data indicates that for the amplifier with sequence number 1, the amplifier category is "5" (indicating that it is a voltage input/voltage output type amplifier); the position of the input terminal (+) is defined by 101; the position of the input terminal (−) is defined by 102; the position of the output terminal (+) is defined by 103; the position of the output terminal (−) is defined by 104; the position of the output terminal (+) is defined by 105; the position of the output terminal (−) is defined by 106; the library name where the amplifier data is to be stored is "# AMP-V-V"; and the library name of the library is "amplib.prv."

The simulation processing executed by the simulation program 100 will now be described below.

The simulation program 100 translates the configuration of the electronic device to be simulated into a mesh and establishes the frequency to be analyzed. Then, the mutual impedance, the mutual admittance, and the mutual reactance between the meshed elements are found, with respect to the established frequency to be analyzed, using a predetermined calculation. The mutual impedance and the like thus found, as well as the wave source designated by the structural information, are substituted into the simultaneous equation of the moment method. By solving the simultaneous equation of the moment method, the electric current and magnetic current flowing in the meshed elements are found.

When considering a metallic object, the metallic portions which are to be analyzed are translated into a mesh, and the mutual impedance $Z_{ij}$ (the value at the frequency to be analyzed) between the meshed metallic elements is found. As shown in FIG. 7, by solving the simultaneous equation of the moment method established by the mutual impedance $Z_{ij}$, wave source $V_i$ of the frequency components, and electric current $I_i$ of the frequency components flowing in the meshed metallic elements, the electric current $I_i$ flowing in the metallic elements is found.

Figure 8:
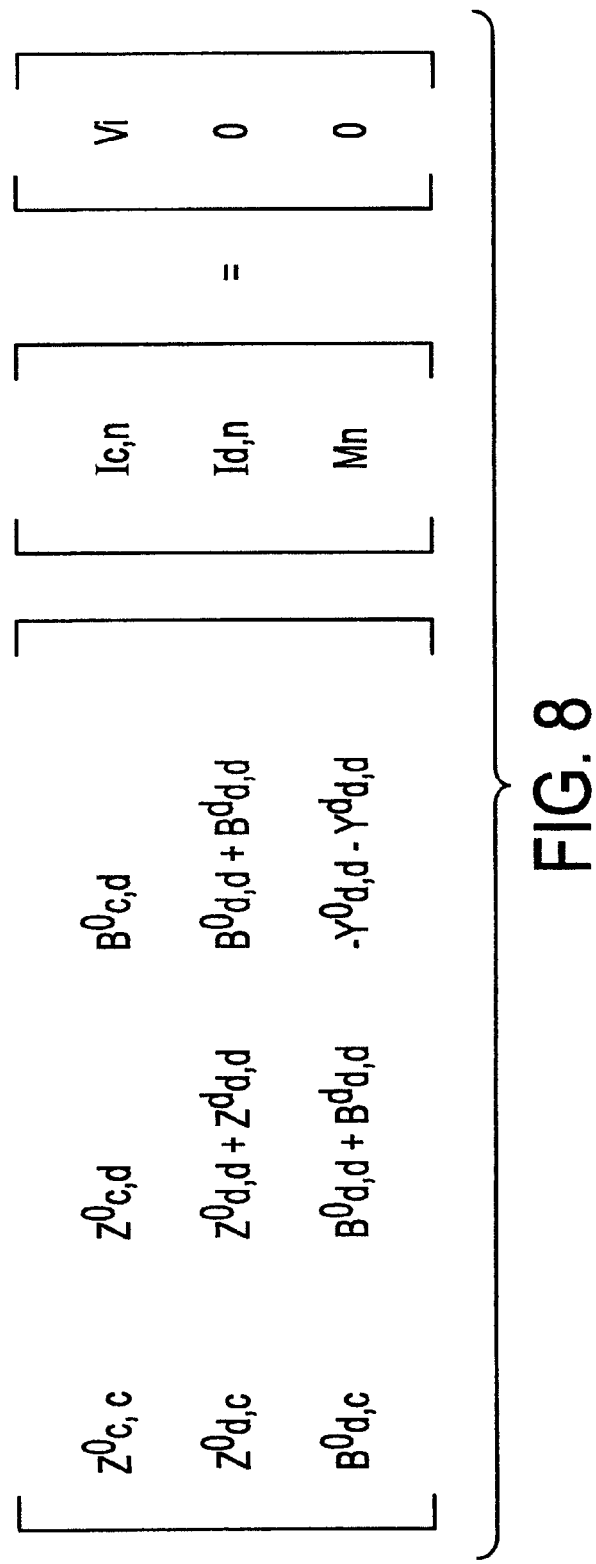
FIG. 8 is a diagram of a simultaneous equation of the moment method in accordance with embodiments of the present invention.

When a dielectric substance is present, the simultaneous equation of the moment method shown in FIG. 8 is solved. As shown in FIG. 8, $Y_{ij}$ is the mutual impedance between the elements; $B_{ij}$ is the mutual admittance between the elements; $I_{c,n}$ is the current flowing in the metal; $I_{d,n}$ is the electric current flowing on the surface of the dielectric substance; $M_n$ is the magnetic current flowing on the surface of the dielectric substance; superscript "0" is the atmospheric value; superscript "d" is the value in the dielectric substance; subscript "c" is metal; and subscript "d" is a dielectric substance.

Figure 9:
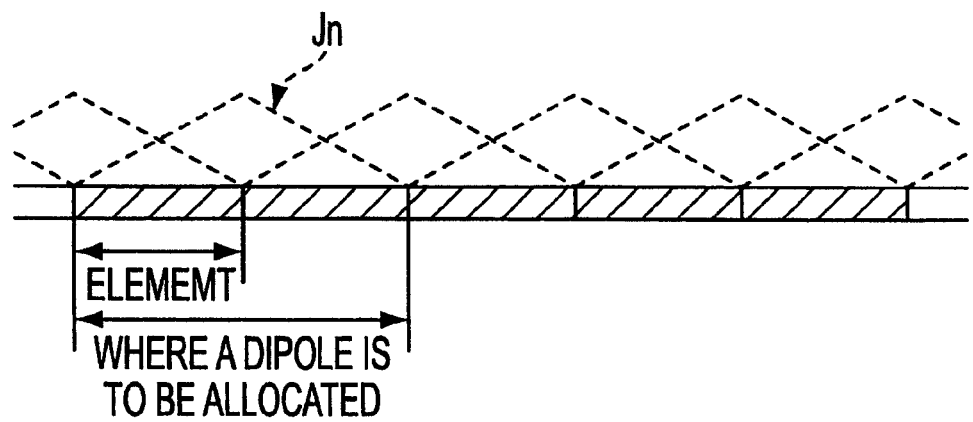
FIG. 9 is a diagram of a dipole in accordance with embodiments of the present invention.

A specific explanation will be given for the calculation of mutual impedance between metal wires. As shown in FIG. 9, when the wires are line partitioned, a dipole (defined by two monopoles) is generated at wires adjacent to each other. The expansion function $J_n$ for the electric current defined by triangular waves and the like is allocated to the dipole, and using the electric current expansion function $J_n$, the current $J_s$ flowing through the wire is expanded thus:

$$J_s = \Sigma I_n \times J_n$$

Here, the coefficient $I_n$ represents the size of the electric current, and ultimately becomes an unknown in the simultaneous equation of the moment method.

Figure 10:
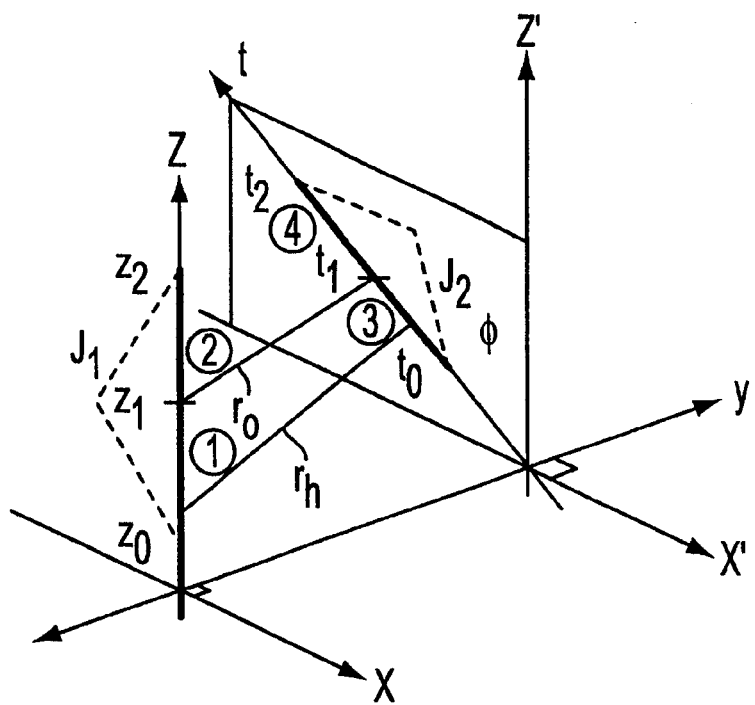
FIG. 10 is a diagram of a method of computing mutual impedance in accordance with embodiments of the present invention.

As shown in FIG. 10, mutual impedance $Z_{ij}$ between element i and element j, to which dipoles have been allocated (defined by two monopoles), is executed by assuming monopoles ① and ② which make up element i and monopoles ③ and ④ which make up element j.

In other words, the usual mutual impedance $Z_{ij}$ between element i and element j is represented by the mathematical expression in FIG. 11A. As shown in FIG. 11A, ω is the angular frequency, k is the wave number, r is the distance between monopoles, $J_1$, $J_2$ are the form of the electric current distribution on the monopoles, φ is the inclination of the monopoles, and $\rho_1 = (-1/j\omega) \times [\delta J_1/\delta t]$, $\rho_2 = (-1/j\omega) \times [\delta J_2/\delta t]$.

By assuming as the electrical current distribution on the monopoles

Electric current monopole ① $J_1 = \sin k(z - z_0)/\sin kd_1$
   Electric current monopole ② $J_1 = \sin k(z_2 - z)/\sin kd_2$
   Electric current monopole ③ $J_2 = \sin k(t - t_0)/\sin kd_3$
   Electric current monopole ④ $J_2 = \sin k(t_2 - t)/\sin kd_4$
    where $d_1$ is the length of monopole ①, $d_2$ is the length of monopole ②,
    $d_3$ is the length of monopole ③, and $d_4$ is the length of monopole ④, mutual impedance $Z_{13}$ between monopole ① and monopole ③ and mutual impedance $Z_{14}$ between monopole ① and monopole ④ are represented by the mathematical expression shown in FIG. 11B.

Mutual impedance $Z_{23}$ between monopole ② and monopole ③ and mutual impedance $Z_{24}$ between monopole ② and monopole ④ are also represented by the same expression. Hereinafter, mutual impedance $Z_{ij}$ between element i and element j will be sought (= $Z_{13} + Z_{14} + Z_{23} + Z_{24}$).

In the above-described manner, the simulation program 100 translates the configuration of the electronic device to be simulated into a mesh, and at the frequency to be analyzed, determines the mutual impedance, mutual admittance and mutual reactance between the meshed elements using a predetermined computation. Then, the simulation program 100 substitutes the mutual impedance and the like thus found, as well as the wave source designated by the structural information, into the simultaneous equation of the moment method. By solving the simultaneous equation of the moment method, the electric current and magnetic current flowing in the elements are determined. When the electronic device to be simulated has an amplifier, the simulation program 100 performs the processing characteristic of the present invention that results in accurate simulation.

Figure 12:
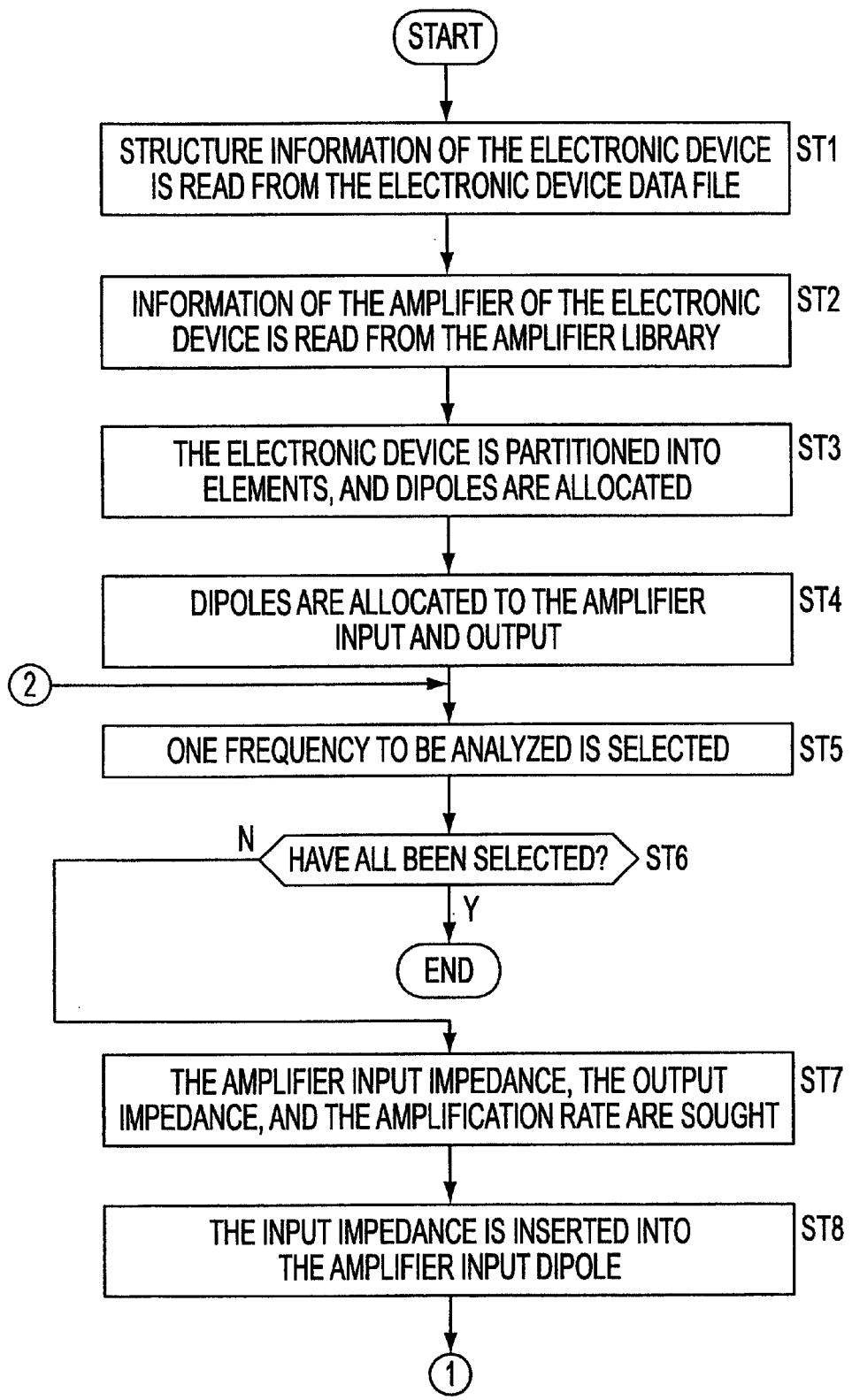
FIG. 12 is a flowchart of an operational process for performing simulation in accordance with embodiments of the present invention.
Figure 13:
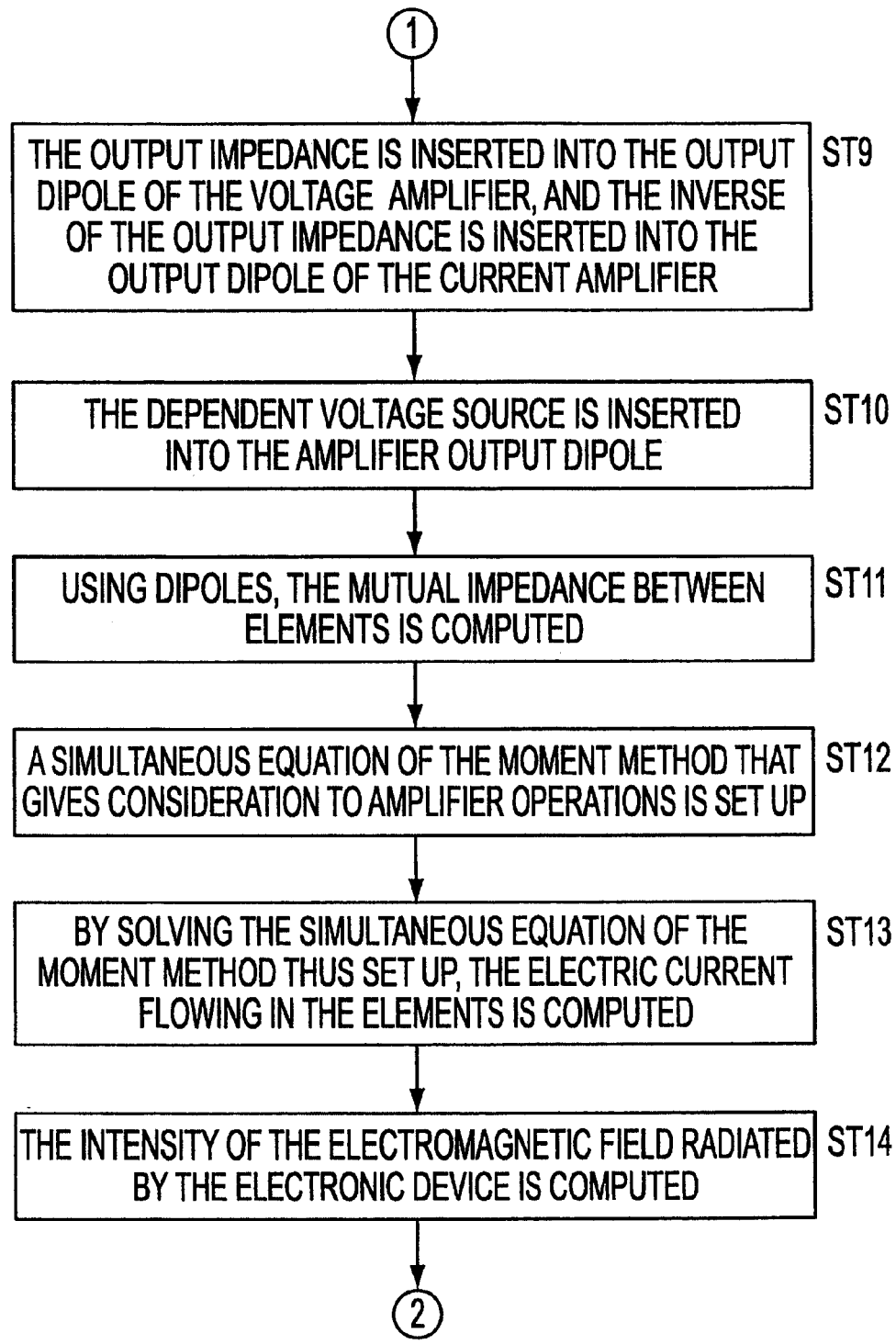
FIG. 13 is a flowchart of an operational process for performing simulation in accordance with embodiments of the present invention.

FIGS. 12 and 13 illustrate a flow chart of an operational process executed by the simulation program 100 in accordance with embodiments of the present invention. A detailed explanation of the present invention will now be provided below with reference to the flow chart. In order to simplify the explanation which follows, no consideration will be given to the presence of a dielectric substance will not be considered.

As shown in FIG. 12, when requested to compute the intensity of the electromagnetic field radiated by an electronic device, the simulation program 100 first reads from the electronic device data file 2 the structure information of the electronic device to be simulated (step ST1). Next, in step ST2, information about the amplifier of that electronic device is read from the amplifier library 4.

Figure 14A:
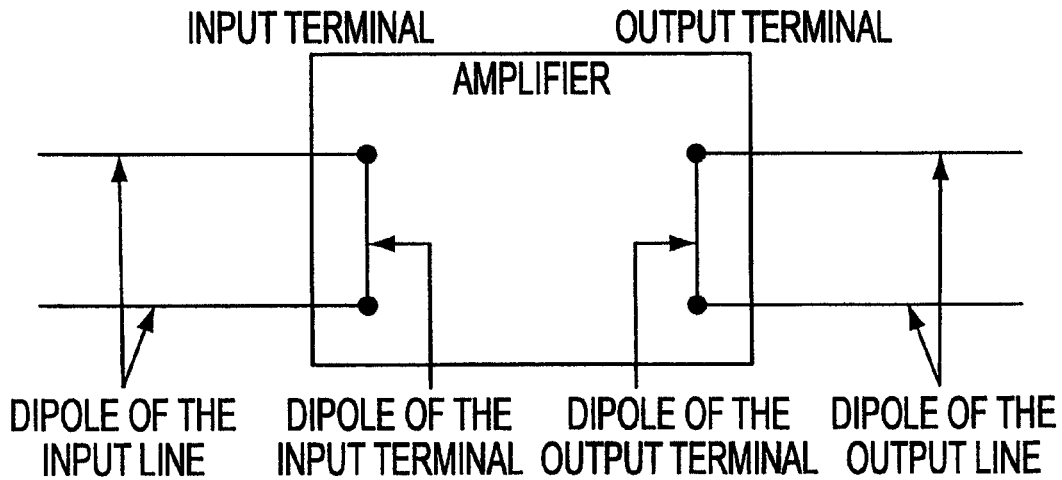
FIGS. 14A–14C are diagrams of the processing of the simulation program in accordance with embodiments of the present invention.

Continuing, in step ST3, the electronic device whose information is read from the data file 2 is partitioned into elements, and dipoles are allocated to pairs of the elements. In step ST4, a dipole is allocated to the input and output of the amplifier of the electronic device, as shown in FIG. 14. When an electronic device is partitioned into elements, the partitioning is done in a shape that matches the shape of the electronic device. Furthermore, the electronic device is partitioned in such a way that, for example, each element has a size less than "0.1×λ" where λ is the wavelength of the frequency to be analyzed. Also, when the length between the input terminals of the amplifier (or between the output terminals) is long, a plurality of dipoles are allocated to the amplifier input (output).

Next, in step ST5, one frequency to be analyzed is selected from the as yet unprocessed frequencies to be analyzed. In step ST6, it is determined whether or not all the frequencies to be analyzed have been selected. If it is determined that all the frequencies to be analyzed have been selected, then the simulation operational process ends.

If, however, in step ST6 it is determined that all the frequencies to be analyzed have not been selected, (i.e., if it is determined that a frequency to be analyzed was selected), then the operational process proceeds to step ST7. Using the information about the form of the input circuit of the amplifier read from the amplifier library 4, the amplifier input impedance $Z_i$ at the selected frequency to be analyzed is calculated; using the information about the form of the output circuit of the amplifier read from the amplifier library 4, the amplifier output impedance $Z_o$ at the selected frequency to be analyzed is calculated; and using the table information of the amplification rate table read from the amplifier library 4, amplification rate A of the amplifier at the selected frequency to be analyzed is specified.

Figure 14B:
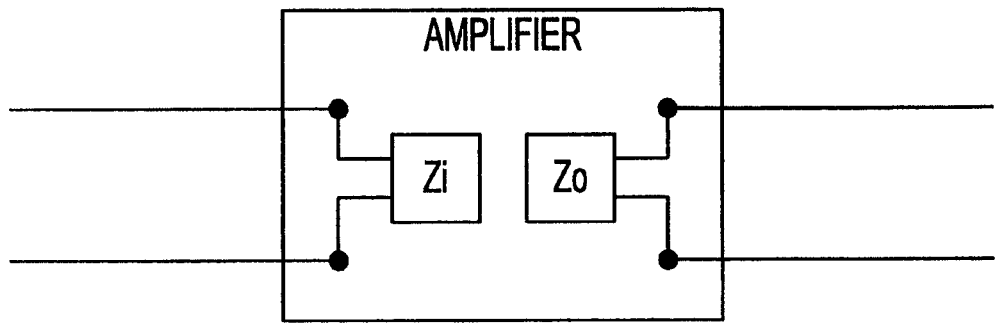

Next, in step ST8, the amplifier input impedance $Z_i$ calculated at step ST7 is inserted at the amplifier input dipole allocated at step ST4, as shown in FIG. 14B.

As shown in FIG. 13, in step ST9, when the amplifier is a voltage amplifier, the amplifier output impedance $Z_o$ calculated in step ST7 is inserted into the amplifier output dipole allocated in step ST4. When the amplifier is a current amplifier, the inverse of the output impedance calculated at step ST7, "$1/Z_o$" is inserted into the amplifier output dipole allocated in step ST4. In other words, when the amplifier is a voltage amplifier, as shown in FIG. 14B, output impedance $Z_o$ is inserted into the amplifier output dipole.

Figure 14C:
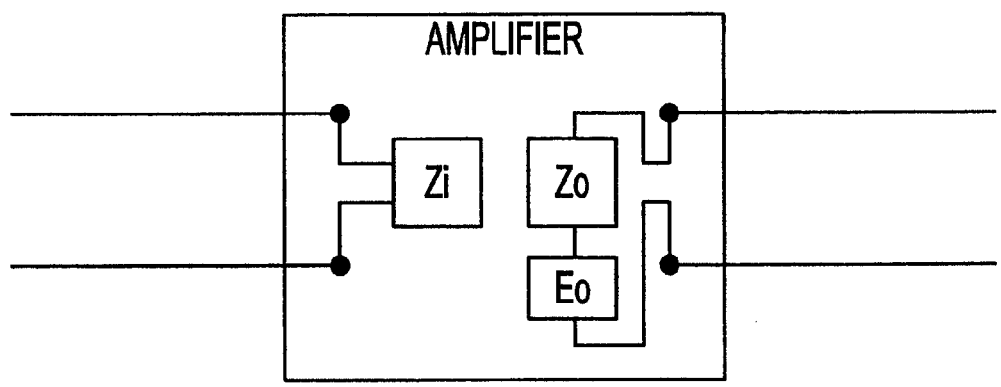

Next, in step ST10, dependent voltage source $E_o$ is inserted into the amplifier output dipole allocated in step ST4, as shown in FIG. 14C.

Specifically, when the amplifier output voltage is dependent upon the input voltage, dependent voltage source $E_o$ is inserted into the amplifier output dipole, which generates voltage corresponding to the product of amplifier input impedance $Z_i$, amplifier amplification rate $A_v$, and the electric current flowing through the amplifier input dipole.

When the amplifier output voltage is dependent upon the input electric current, dependent voltage source $E_o$ is inserted into the amplifier output dipole, which generates voltage corresponding to the product of amplifier amplification rate $A_i$ and the current flowing through the amplifier input dipole.

When the amplifier output current is dependent upon the input voltage, dependent voltage source $E_o$ is inserted into the amplifier output dipole which generates voltage corresponding to the product of amplifier input impedance $Z_i$, amplifier output impedance $Z_o$, amplifier amplification rate $A_i$, and the electric current flowing in the amplifier input dipole.

When the amplifier output current is dependent upon the input current, dependent voltage source $E_o$ is inserted into the amplifier output dipole, which generates voltage corresponding to the product of the amplifier output impedance $Z_o$, amplifier amplification rate $A_i$ and the electric current flowing through the amplifier input dipole.

Next, in step ST11, using the dipoles allocated in step ST3 and step ST4, a calculation of the mutual impedance $Z_{ij}$ between the elements of the electronic device is performed at a frequency to be analyzed, as selected in step ST5.

Next, in step ST12, a simultaneous equation of the moment method that gives consideration to amplification operations is set up from the input impedance $Z_i$ inserted in step ST8, the output impedance $Z_o$ inserted at step ST9 or its inverse "$1/Z_o$," dependent voltage source $E_o$ inserted in step ST10, and mutual impedance $Z_{ij}$ calculated in step ST11.

In step ST13, by solving the simultaneous equation of the moment method set up at step ST12, the electric current flowing in the elements of the electronic device is calculated. Finally, in step ST14, the intensity of the electromagnetic field radiated by the electronic device is calculated from the electric current flowing in the elements using a commonly known formula, thus determining the intensity of the electromagnetic field radiated by the electronic device at the frequency to be analyzed, as selected in step ST5. After calculating the intensity of the electromagnetic field, in order to begin the simulation processing for the next frequency to be analyzed, the operational process returns to step ST5.

In the above-described manner, when the electronic device to be simulated has an amplifier, the simulation program 100 creates an accurate simulation model of the amplifier by providing a dependent voltage source that generates an electric current and voltage dependent upon the input voltage and input current of the amplifier. In accordance with that simulation model, the simulation program 100 executes the simulation processing.

The simultaneous equation of the moment method created by the simulation program 100 will now be explained in detail hereinbelow.

Figure 15:
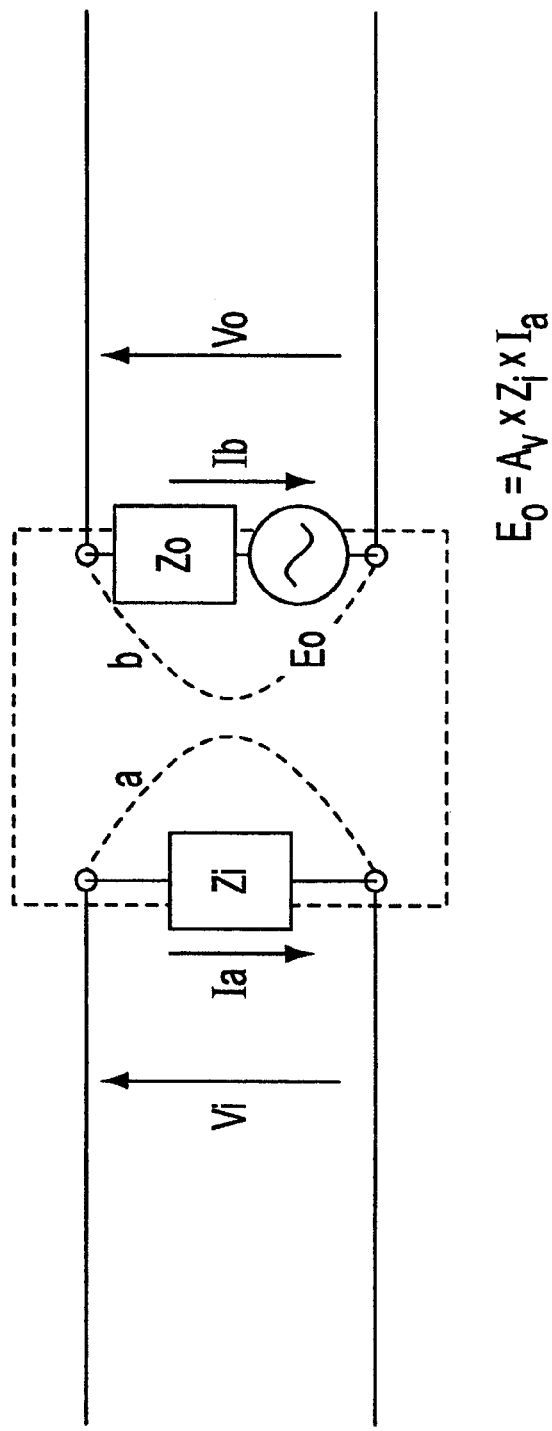
FIG. 15 is a diagram of a simulation model created in accordance with the embodiments of the present invention.

The case of an amplifier that outputs voltage $V_o$ which has been multiplied by amplification ratio $A_v$, in response to changes in input voltage $V_{iv}$ will be discussed first below. In this case, in accordance with the operational process shown in FIG. 12 and FIG. 13, the simulation program 100 generates the simulation model shown in FIG. 15. As shown in FIG. 15, a in the figure is the input dipole allocated to the amplifier input, b is the output dipole allocated to the amplifier output, $I_a$ is the electric current flowing in the input dipole a, and $I_b$ is the electric current flowing in the output dipole b.

At this time, dependent voltage source $E_o$ generates the following voltage, which varies in response to electric current $I_a$ flowing through the input dipole a:

$$E_o = A_v \times V_i = A_v \times Z_i \times I_a,$$

where $Z_i$=amplifier input impedance.

Pursuant to this simulation model, the simulation program 100 creates the simultaneous equation of the moment method shown in FIG. 16. By solving the simultaneous equation of the moment method shown in FIG. 16, the electric current flowing through the electronic device is simulated. $V_s$ in FIG. 16 indicates the wave source of the electronic device.

Here, input impedance $Z_i$ is inserted in input dipole a, and self-impedance $Z_{aa}$ of input dipole a appears to be $$Z_{aa} \to Z_{aa} + Z_i.$$

Output impedance $Z_o$ is inserted in output dipole b, and self-impedance $Z_{bb}$ of output dipole b appears to be $$Z_{bb} \to Z_{bb} + Z_o.$$

Also, the reason that the term "$Z_{ba} - A_v \times Z_i$" appears is that terms relating to dependent voltage source $E_o$ are moved from the right side to the left side.

Figure 17:
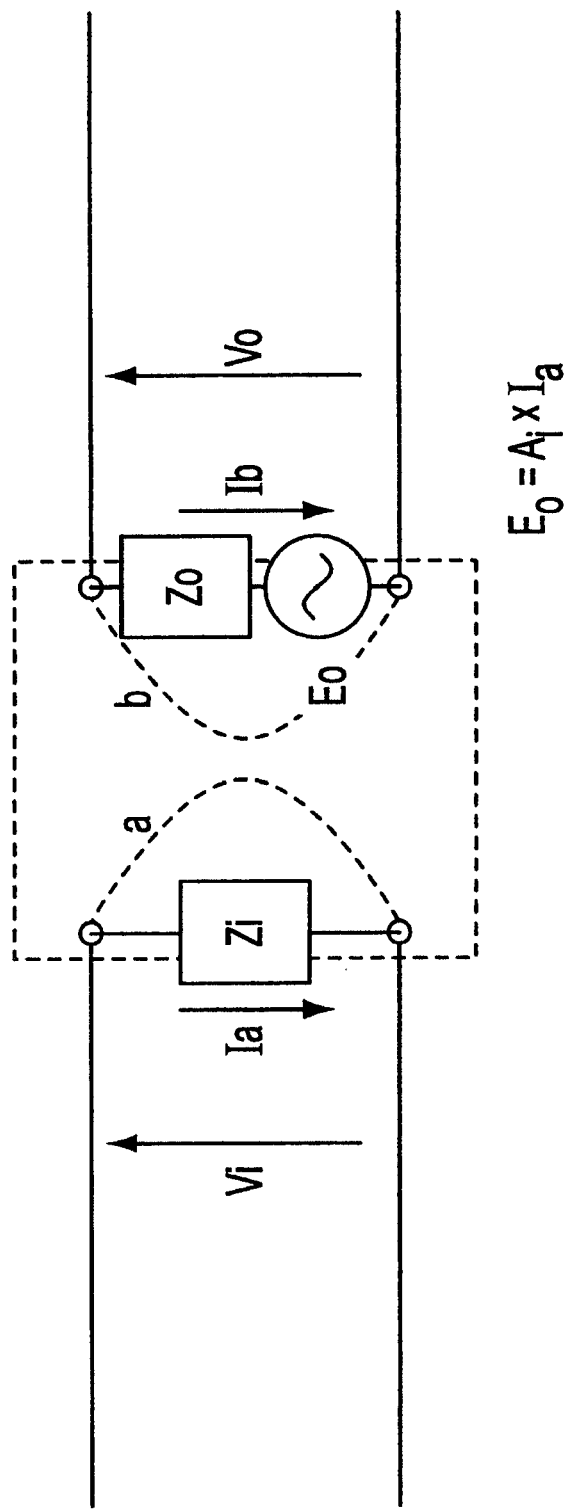
FIG. 17 is a diagram of a simulation model created in accordance with embodiments of the present invention.

The case of an amplifier that outputs voltage $V_o$ which has been multiplied by amplification ratio $A_i$ in response to changes in input current $I_i$ will now be discussed below. In this case, in accordance with the operational process shown in FIG. 12 and FIG. 13, the simulation program 100 generates the simulation model shown in FIG. 17. As shown in FIG. 17, a in the figure is the input dipole allocated to the amplifier input, b is the output dipole allocated to the amplifier output, $I_a$ is the electric current flowing in the input dipole a, and $I_b$ is the electric current flowing in the output dipole b.

At this time, dependent voltage source $E_o$ generates the following voltage, which varies in response to electric current $I_a$ flowing through the input dipole a:

$$E_o = A_i \times I_i = A_i \times I_a.$$

Pursuant to this simulation model, the simulation program 100 creates the simultaneous equation of the moment method shown in FIG. 18. By solving the simultaneous equation of the moment method shown in FIG. 18, the electric current flowing through the electronic device is simulated.

Here, input impedance $Z_i$ is inserted in input dipole a, and self-impedance $Z_{aa}$ of input dipole a appears to be $$Z_{aa} \to Z_{aa} + Z_i.$$

Output impedance $Z_o$ is inserted in output dipole b, and self-impedance $Z_{bb}$ of output dipole b appears to be $$Z_{bb} \to Z_{bb} + Z_o.$$

Also, the reason that the term "$Z_{ba} - A_i$" appears is that terms relating to dependent voltage source $E_o$ are moved from the right side to the left side.

Figure 19:
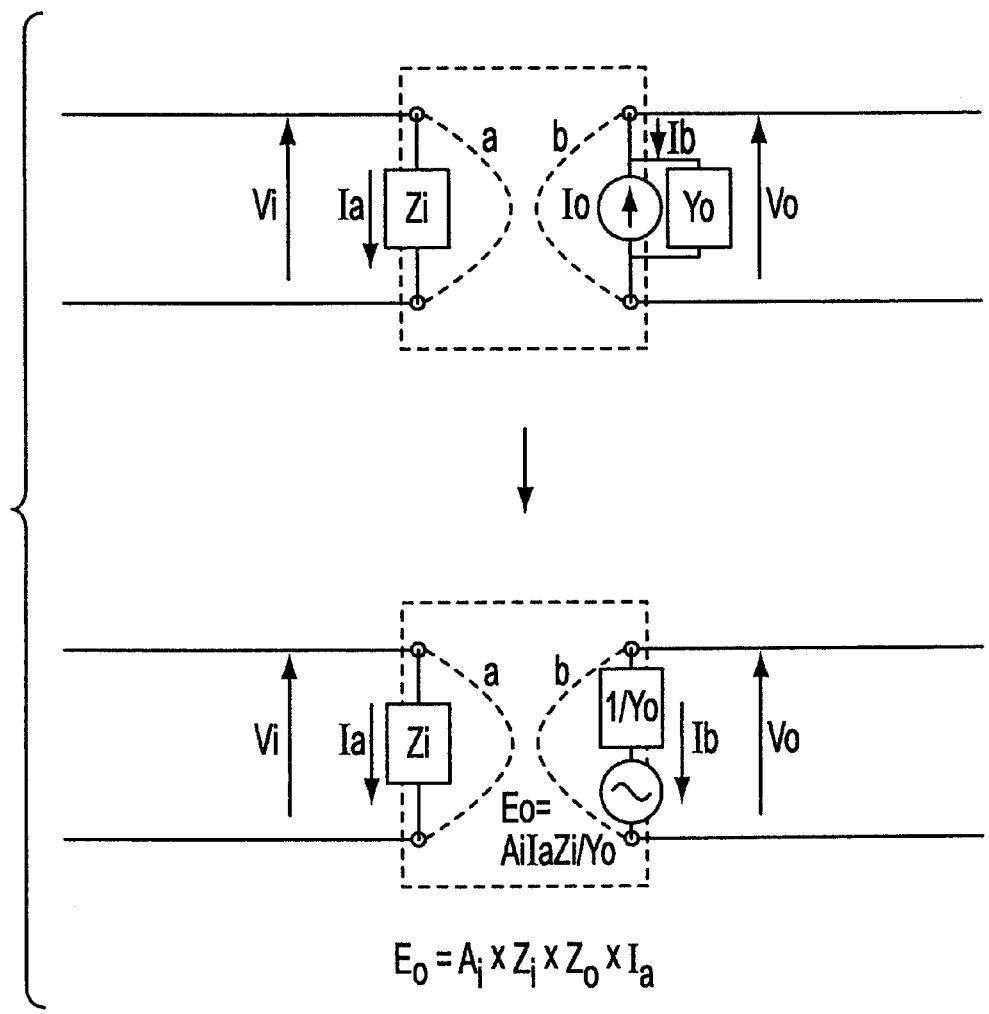
FIG. 19 is a diagram of a simulation model created in accordance with the embodiments of the present invention.

The case of an amplifier that outputs electric current $I_o$ which has been multiplied by amplification ratio $A_i$ in response to changes in input voltage $V_i$ will now be discussed below. In this case, in accordance with the operational process shown in FIG. 12 and FIG. 13, the simulation program 100 generates the simulation model shown in FIG. 19. As shown in FIG. 19, a in the figure is the input dipole allocated to the amplifier input, b is the output dipole allocated to the amplifier output, $I_a$ is the electric current flowing in the input dipole a, $I_b$ is the electric current flowing in the output dipole b, and $Y_o$ is the inverse (admittance) of the amplifier output impedance $Z_o$.

At this time, dependent voltage source $E_o$ generates the following voltage, which varies in response to electric current $I_a$ flowing through the input dipole a:

$$E_o = I_o / Y_o = (A_i \times V_i) / Y_o = (A_i \times Z_i \times I_a) / Y_o = A_i \times Z_i \times Z_o \times I_a,$$

where $Z_i$ = amplifier input impedance, and
$Z_o$ = amplifier output impedance.

In accordance with the simulation model, the simulation program 100 creates the simultaneous equation of the moment method shown in FIG. 20. By solving the simultaneous equation of the moment method shown in FIG. 20, the electric current flowing through the electronic device is simulated.

Here, input impedance $Z_i$ is inserted in input dipole a, and self-impedance $Z_{aa}$ of input dipole a appears to be $$Z_{aa} \to Z_{aa} + Z_i.$$

Output impedance $Z_o$ is inserted in output dipole b, and self-impedance $Z_{bb}$ of output dipole b appears to be $$Z_{bb} \to Z_{bb} + Z_o.$$

Also, the reason that the term "$Z_{ba} - A_i \times Z_i \times Z_o$" appears is that terms relating to dependent voltage source $E_o$ are moved from the right side to the left side.

Figure 21:
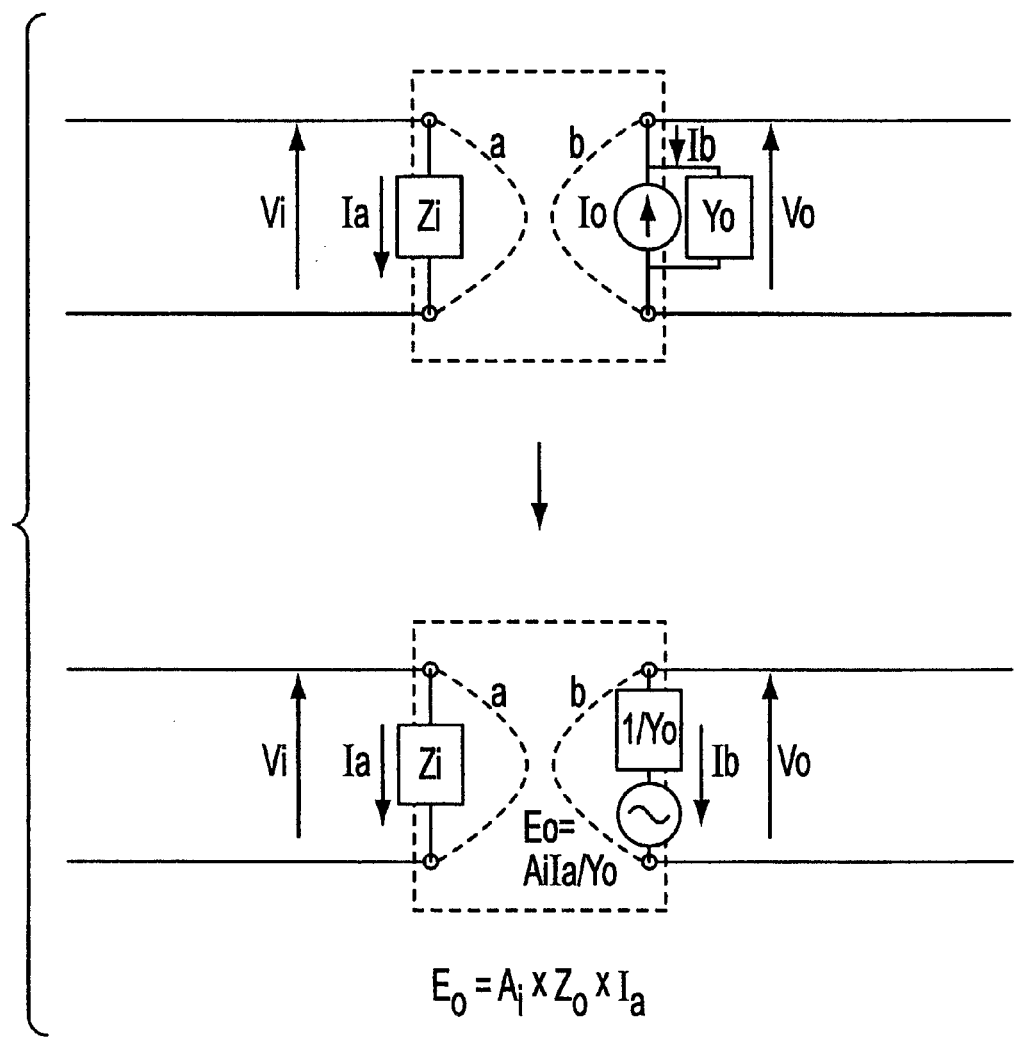
FIG. 21 is a diagram of a simulation model created in accordance with the embodiments of the present invention.

The case of an amplifier that outputs electric current $I_o$ which has been multiplied by the amplification ratio $A_i$ in response to changes in input current $I_i$ will now be described below. In this case, in accordance with the operational process shown in FIG. 12 and FIG. 13, the simulation program 100 generates the simulation model shown in FIG. 21. As shown in FIG. 21, a in the figure is the input dipole allocated to the amplifier input, b is the output dipole allocated to the amplifier output, $I_a$ is the electric current flowing in the input dipole a, $I_b$ is the electric current flowing in the output dipole b, and $Y_o$ is the inverse (admittance) of the amplifier output impedance $Z_o$.

At this time, dependent voltage source $E_o$ generates the following voltage, which varies in response to electric current $I_a$ flowing through the input dipole a:

$$E_o = I_o / Y_o = (A_i \times I_i) / Y_o = (A_i \times I_a) / Y_o = A_i \times Z_o \times I_a,$$

where $Z_o$ is amplifier output impedance.

In accordance with this simulation model, the simulation program 100 creates the simultaneous equation of the moment method shown in FIG. 22. By solving the simultaneous equation of the moment method shown in FIG. 22, the electric current flowing through the electronic device is simulated.

Here, input impedance $Z_i$ is inserted in input dipole a, and self-impedance $Z_{aa}$ of input dipole a appears to be $$Z_{aa} \to Z_{aa} + Z_i.$$

Output impedance $Z_o$ is inserted in output dipole b, and self-impedance $Z_{bb}$ of output dipole b appears to be $$Z_{bb} \to Z_{bb} + Z_o.$$

Also, the reason that the term "$Z_{ba} - A_i \times Z_o$" appears is that terms relating to dependent voltage source $E_o$ are moved from the right side to the left side.

Figure 23:
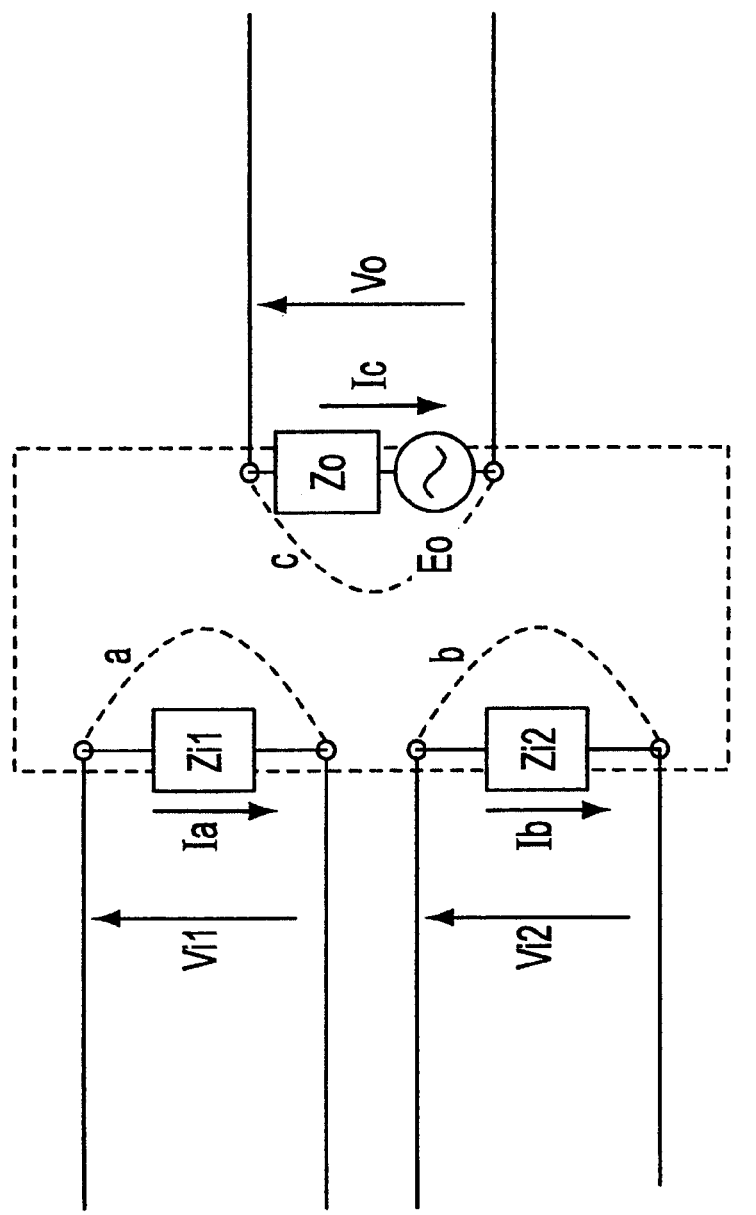
FIG. 23 is a diagram of a simulation model created in accordance with the embodiments of the present invention.

The case of an amplifier that outputs voltage $V_o$ which has been multiplied by amplification ratio $A_v$ in response to the voltage differential ($V_{i1} - V_{i2}$) between two inputs will now be described hereinbelow. In this case, in accordance with the operational process shown in FIG. 12 and FIG. 13, the simulation program 100 generates the simulation model shown in FIG. 23. As shown in FIG. 23, a in the figure is the input dipole allocated to the amplifier input, b is the output dipole allocated to the amplifier output, c is the dipole allocated to the amplifier output, $I_a$ is the electric current flowing in the input dipole a, $I_b$ is the electric current flowing in the output dipole b, $I_c$ is the electric current flowing in output dipole c, $Z_{i1}$ is the input impedance of input 1, and $Z_{i2}$ is the input impedance of input 2.

At this time, dependent voltage source $E_o$ generates the following voltage, which varies in response to electric current $I_a$ flowing through the input dipole a and electric current $I_b$ flowing through dipole b:

$$E_o = A_v(V_{i1} - V_{i2}) = A_v(Z_{i1} \times I_a - Z_{i2} \times I_b)$$

In accordance with this simulation model, the simulation program 100 creates the simultaneous equation of the moment method shown in FIG. 24. By solving the simultaneous equation of the moment method shown in FIG. 24, the electric current flowing through the electronic device is simulated.

Here, input impedance $Z_{i1}$ of input 1 is inserted in input dipole a, and self-impedance $Z_{aa}$ of input dipole a appears to be $$Z_{aa} \rightarrow Z_{aa} + Z_{i1}.$$

Input impedance $Z_{i2}$ of input 2 is inserted in input dipole b, and self-impedance $Z_{i2}$ of input dipole b appears to be $$Z_{bb} \rightarrow Z_{bb} + Z_{i2}.$$

Output impedance $Z_o$ is inserted in output dipole c, and self-impedance $Z_{cc}$ of output dipole c appears to be $$Z_{cc} \rightarrow Z_{cc} + Z_o.$$

Also, the reason that the terms "$Z_{ca} - A_v \times Z_{i1}$" and "$Z_{cb} + A_v \times Z_{i2}$" appear is that terms relating to dependent voltage source $E_o$ are moved from the right side to the left side.

Figure 25:
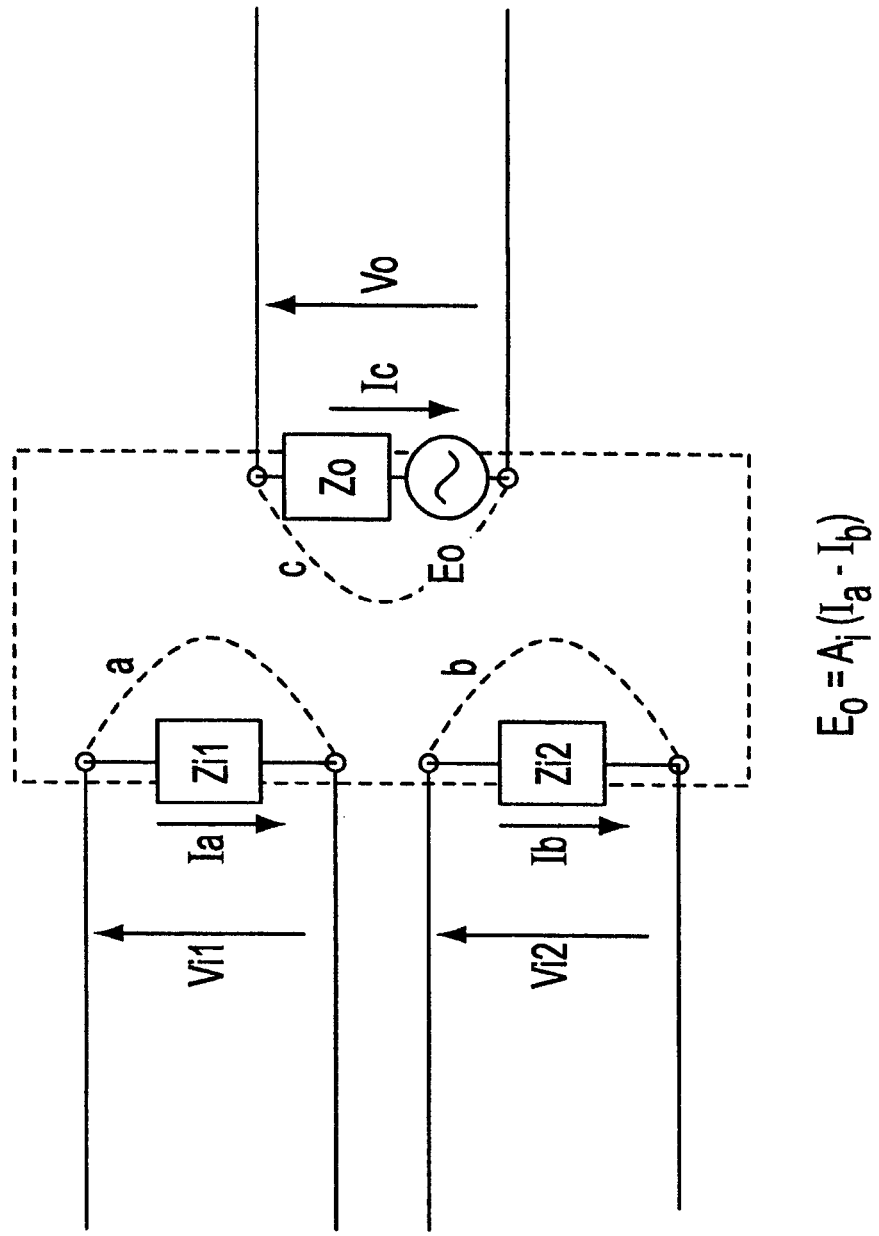
FIG. 25 is a diagram of a simulation model created in accordance with the embodiments of the present invention.

The case of an amplifier that outputs voltage $V_o$ which has been multiplied by amplification ratio $A_i$ in response to the electric current differential $(I_a - I_b)$ between two inputs will now be described below. In this case, in accordance with the operational process shown in FIG. 12 and FIG. 13, the simulation program 100 generates the simulation model shown in FIG. 25. As shown in FIG. 25, a in the figure is the input dipole allocated to the amplifier input, b is the output dipole allocated to the amplifier output, c is the dipole allocated to the amplifier output, $I_a$ is the electric current flowing in the input dipole a, $I_b$ is the electric current flowing in the output dipole b, $I_c$ is the electric current flowing in output dipole c, $Z_{i1}$ is the input impedance of input 1, and $Z_{i2}$ is the input impedance of input 2.

At this time, dependent voltage source $E_o$ generates the following voltage, which varies in response to electric current $I_a$ flowing through the input dipole a and electric current $I_b$ flowing through dipole b:

$$E_o = A_i(I_a - I_b)$$

In accordance with this simulation model, the simulation program 100 creates the simultaneous equation of the moment method shown in FIG. 26. By solving the simultaneous equation of the moment method shown in FIG. 26, the electric current flowing through the electronic device is simulated.

Here, input impedance $Z_{i1}$ of input 1 is inserted in input dipole a, and self-impedance $Z_{aa}$ of input dipole a appears to be $$Z_{aa} \rightarrow Z_{aa} + Z_{i1}.$$

Input impedance $Z_{i2}$ of input 2 is inserted in input dipole b, and self-impedance $Z_{bb}$ of input dipole b appears to be $$Z_{bb} \rightarrow Z_{bb} + Z_{i2}.$$

Output impedance $Z_o$ is inserted in output dipole c, and self-impedance $Z_{cc}$ of output dipole c appears to be $$Z_{cc} \rightarrow Z_{cc} + Z_o.$$

Also, the reason that the terms "$Z_{ca} - A_i$" and "$Z_{cb} + A_i$" appear is that terms relating to dependent voltage source $E_o$ are moved from the right side to the left side.

The case of an amplifier that outputs electric current $I_o$ which has been multiplied by amplification ratio $A_i$ in response to the voltage differential between the two inputs $(V_{i1} - V_{i2})$ will now be described below.

Figure 27:
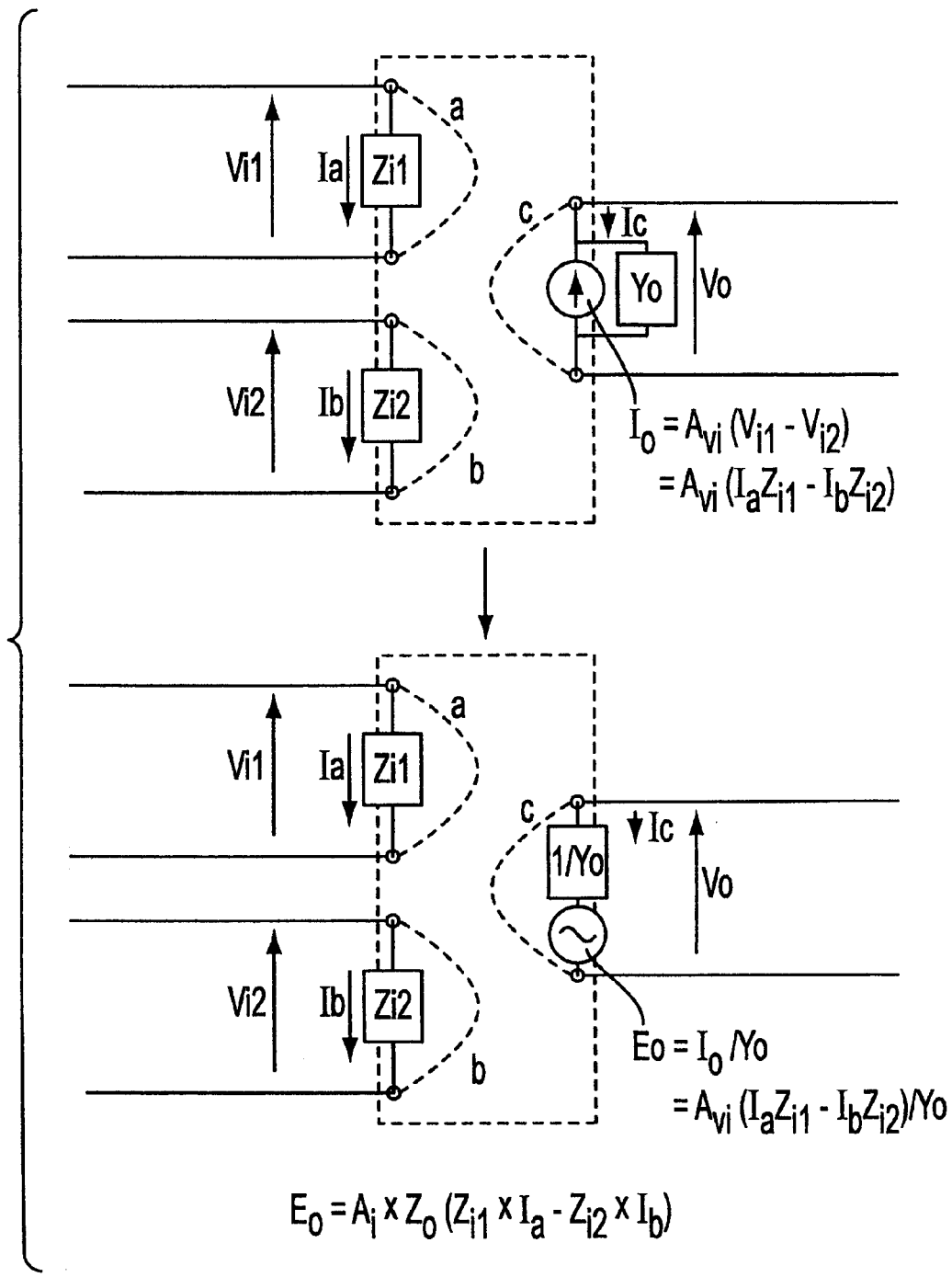
FIG. 27 is a diagram of a simulation model created in accordance with the embodiments of the present invention.

In this case, in accordance with the operational process shown in FIG. 12 and FIG. 13, the simulation program 100 generates the simulation model shown in FIG. 27. As shown in FIG. 27, a in the figure is the input dipole allocated to the amplifier input, b is the output dipole allocated to the amplifier output, c is the dipole allocated to the amplifier output, $I_a$ is the electric current flowing in the input dipole a, $I_b$ is the electric current flowing in the output dipole b, $I_c$ is the electric current flowing in output dipole c, $Z_{i1}$ is the input impedance of input 1, $Z_{i2}$ is the input impedance of input 2, and $Y_o$ is the inverse (admittance) of amplifier output impedance $Z_o$.

At this time, dependent voltage source $E_o$ generates the following voltage, which varies in response to electric current $I_a$ flowing through the input dipole a and electric current $I_b$ flowing through dipole b:

$$E_o = I_o/Y_o = A_i(V_{i1} - V_{i2})/Y_o$$

$$= A_i(Z_{i1}I_a - Z_{i2}I_b)/Y_o$$

$$= A_i \times Z_o(Z_{i1}I_a - Z_{i2}I_b).$$

In accordance with this simulation model, the simulation program 100 creates the simultaneous equation of the moment method shown in FIG. 28. By solving this, the electric current flowing through the electronic device is simulated.

Here, input impedance $Z_{i1}$ of input 1 is inserted in input dipole a, and self-impedance $Z_{aa}$ of input dipole a appears to be $$Z_{aa} \rightarrow Z_{aa} + Z_{i1}.$$

Input impedance $Z_{i2}$ of input 2 is inserted in input dipole b, and self-impedance $Z_{i2}$ of input dipole b appears to be $$Z_{bb} \rightarrow Z_{bb} + Z_{i2}.$$

Output impedance $Z_o$ is inserted in output dipole c, and self-impedance $Z_{cc}$ of output dipole c appears to be $$Z_{cc} \rightarrow Z_{cc} + Z_o.$$

Also, the reason that the terms "$Z_{ca} - A_i \times Z_{i1} \times Z_o$" and "$Z_{cb} + A_i \times Z_{i2} \times Z_o$" appear is that terms relating to dependent voltage source $E_o$ are moved from the right side to the left side.

Figure 29:
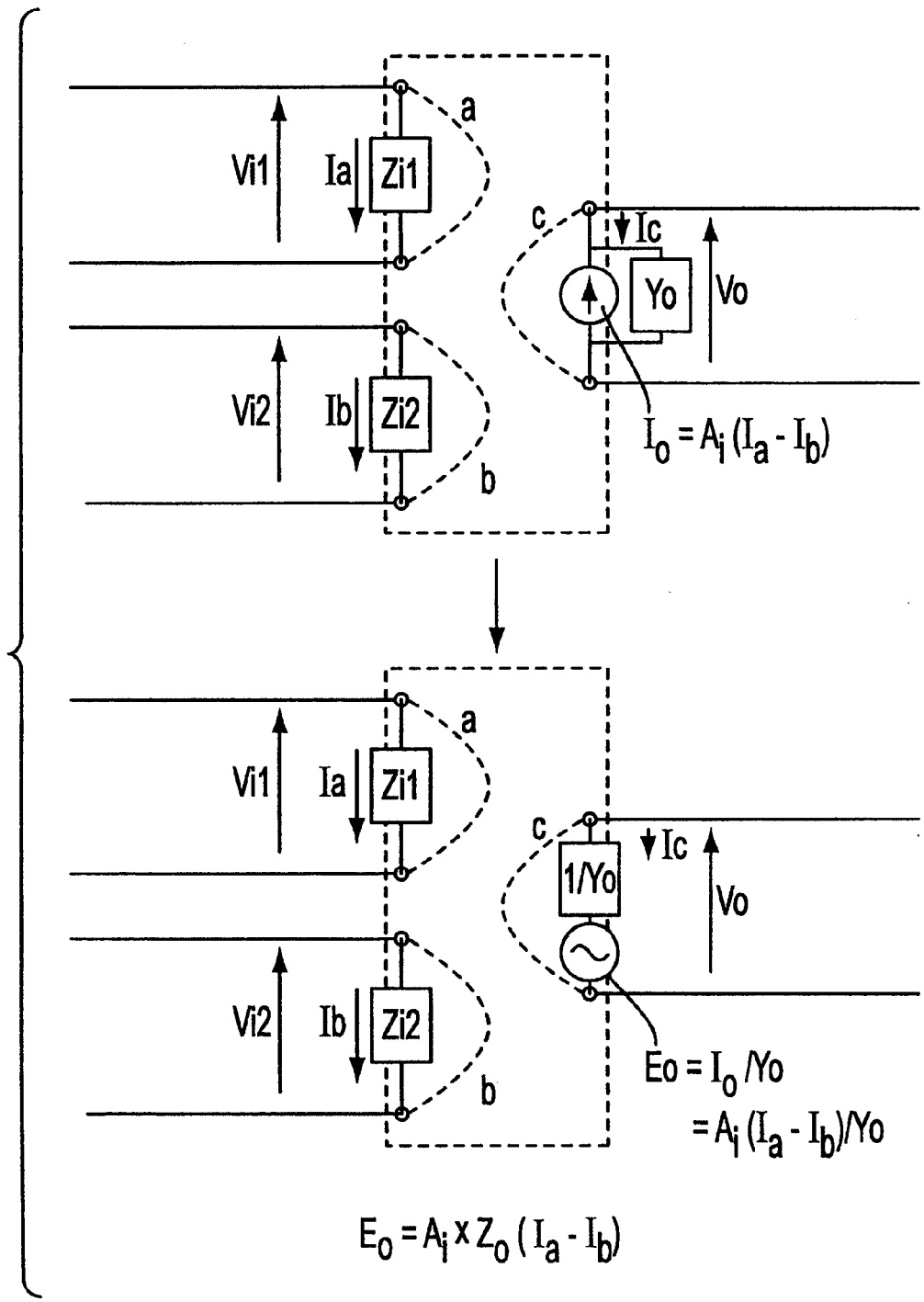
FIG. 29 is a diagram of a simulation model created in accordance with the embodiments of the present invention.

The case of an amplifier that outputs electric current $I_o$ which has been multiplied by amplification ratio $A_i$ in response to the electric current differential between the two inputs $(I_a - I_b)$ will now be described below. In this case, in accordance with the operational process shown in FIG. 12 and FIG. 13, the simulation program 100 generates the simulation model shown in FIG. 29. As shown in FIG. 29, a in the figure is the input dipole allocated to the amplifier input, b is the output dipole allocated to the amplifier output, c is the dipole allocated to the amplifier output, $I_a$ is the electric current flowing in the input dipole a, $I_b$ is the electric current flowing in the output dipole b, $I_c$ is the electric current flowing in output dipole c, $Z_{i1}$ is the input impedance of input 1, $Z_{i2}$ is the input impedance of input 2, and $Y_o$ is the inverse (admittance) of amplifier output impedance $Z_o$.

At this time, dependent voltage source $E_o$ generates the following voltage, which varies in response to electric current $I_a$ flowing through the input dipole a and electric current $I_b$ flowing through dipole b:

$$E_o = I_o/Y_o = A_i(I_a-I_b)/Y_o$$
$$= A_i \times Z_o(I_a-I_b).$$

In accordance with this simulation model, the simulation program 100 creates the simultaneous equation of the moment method shown in FIG. 30. By solving the simultaneous equation of the moment method shown in FIG. 30, the electric current flowing through the electronic device is simulated.

Here, input impedance $Z_{i1}$ of input 1 is inserted in input dipole a, and self-impedance $Z_{aa}$ of input dipole a appears to be $$Z_{aa} \rightarrow Z_{aa} + Z_{i1}.$$

Input impedance $Z_{i2}$ of input 2 is inserted in input dipole b, and self-impedance $Z_{i2}$ of input dipole b appears to be $$Z_{bb} \rightarrow Z_{bb} + Z_{i2}.$$

Output impedance $Z_o$ is inserted in output dipole c, and self-impedance $Z_{cc}$ of output dipole c appears to be $$Z_{cc} \rightarrow Z_{cc} + Z_o.$$

Also, the reason that the terms "$Z_{ca} - A_i \times Z_o$" and "$Z_{cb} + A_i \times Z_o$" appear is that terms relating to dependent voltage source $E_o$ are moved from the right side to the left side.

The simulation program 100 also has the function of simulating the effect that the voltage between any two points (for example, power source voltage) has on the amplifier, although not specifically shown in FIGS. 12 and 13. This simulation function allocates a dipole between two designated points. It also inserts into that dipole thus allocated an impedance for observation corresponding to the impedance between those two points, and inserts into the amplifier output dipole a dependent voltage source that generates voltage specified by the product of the value indicating the effect of the voltage between those two points, the impedance for observation, and the electric current flowing through the dipole thus allocated. In the above-described manner, the simulation function is realized.

Figure 31:
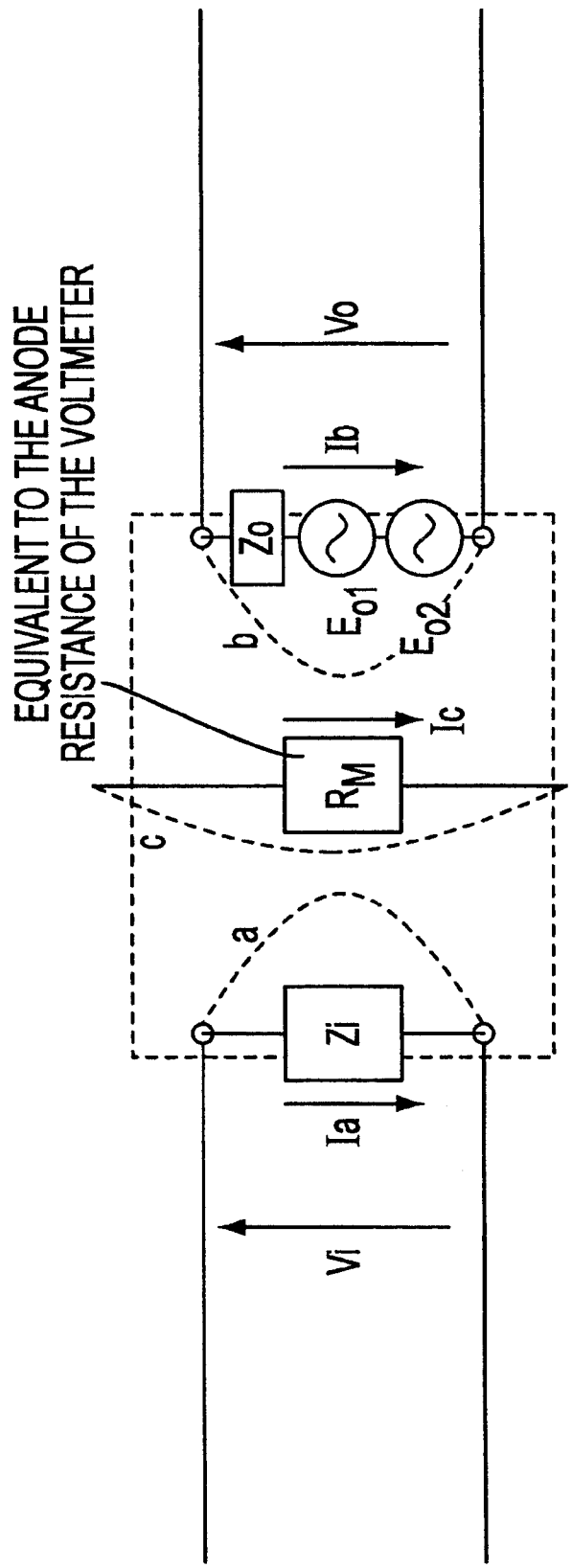
FIG. 31 is a diagram of a simulation model created in accordance with the embodiments of the present invention.

In other words, when there is a need to simulate the effect of the voltage between two designated points on the amplifier, as shown in FIG. 31, the simulation program 100 allocates dipole c between the two designated points, and inserts impedance for observation $R_M$ corresponding to the impedance between those two points into the dipole thus allocated, and inserts a dependent voltage source $E_{o2}$ into the amplifier output dipole b that generates voltage specified by the product of the value $A_M$ indicating the effect of the voltage between those two points, the impedance for observation $R_M$, and the electric current $I_c$ flowing through the dipole thus allocated.

Here, in addition to dependent voltage $E_{o2}$, the original dependent voltage $E_{o1}$, which generates the voltage "$E_o = A_v \times Z_i \times I_a$" as explained above, is also inserted into amplifier output dipole b.

In accordance with this simulation model, the simulation program 100 creates the simultaneous equation of the moment method shown in FIG. 32. By solving the simultaneous equation of the moment method shown in FIG. 32, the electric current flowing through the electronic device is simulated.

Here, input impedance $Z_i$ of input 1 is inserted in input dipole a, and self-impedance $Z_{aa}$ of input dipole a appears to be $$Z_{aa} \rightarrow Z_{aa} + Z_i.$$

Input impedance $Z_o$ of input 2 is inserted in input dipole b, and self-impedance $Z_{bb}$ of input dipole b appears to be $$Z_{bb} \rightarrow Z_{bb} + Z_o.$$

Output impedance $R_m$ is inserted in output dipole c, and self-impedance $Z_{cc}$ of output dipole c appears to be $$Z_{cc} \rightarrow Z_{cc} + R_m.$$

Also, the reason that the term "$Z_{ba} - A_v \times Z_i$" appears is that terms relating to dependent voltage source $E_{o1}$ are moved from the right side to the left side. The reason that the term "$Z_{bc} - A_M \times R_M$" appears is that terms relating to dependent voltage source $E_{o2}$ are moved from the right side to the left side.

The simulation program 100 also has the function of simulating the effect that the electric current between any two points has on the amplifier. This simulation function allocates a dipole between two designated points. The simulation function also inserts into the amplifier output dipole a dependent voltage source that generates voltage specified by the product of the value $A_M$ indicating the effect of the electric current between those two points and the electric current flowing through dipoles c and d. In this manner, the simulation function is realized.

Figure 33:
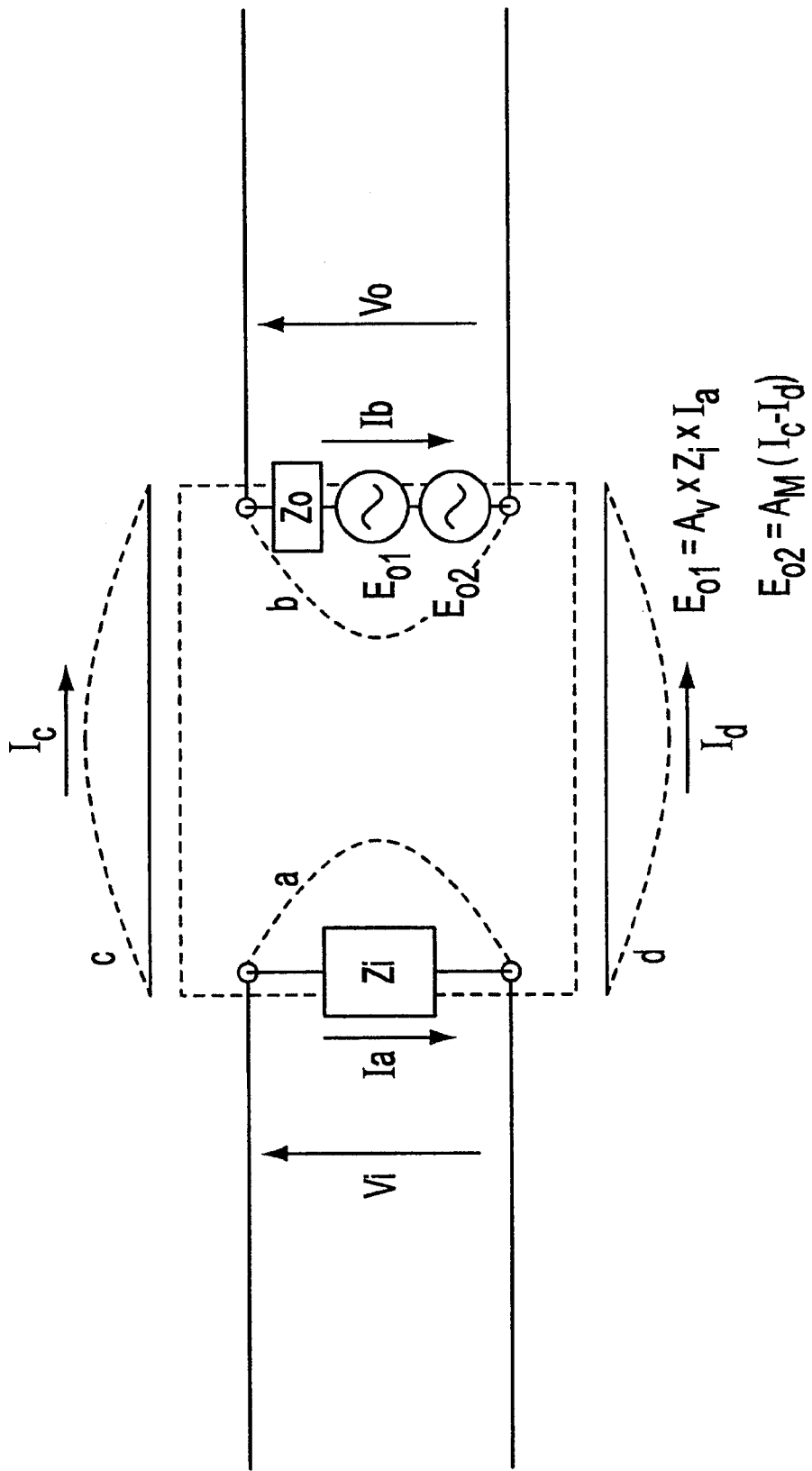
FIG. 33 is a diagram of a simulation model created in accordance with the embodiments of the present invention.

In other words, when there is a need to simulate the effect of the electric current between two designated points on the amplifier, as shown in FIG. 33 (this figure posits two pairs of designated points), the simulation program allocates dipoles c and d between the two designated points, and into the amplifier output dipole b inserts a dependent voltage source $E_{o2}$ that generates voltage "$A_M (I_c-I_d)$" specified by the product of the value $A_M$ indicating the effect of the electric current flowing between those two points and the electric currents $I_c$ and $I_d$ flowing through dipoles c and d.

Here, in addition to dependent voltage $E_{o2}$, the original dependent voltage $E_{o1}$, which generates the voltage "$E_o = A_v \times Z_i \times I_a$" as described above, is also inserted into amplifier output dipole b.

In accordance with this simulation model, the simulation program 100 creates the simultaneous equation of the moment method shown in FIG. 34. By solving the simultaneous equation of the moment method shown in FIG. 34, the electric current flowing through the electronic device is simulated.

Here, input impedance $Z_i$ of input 1 is inserted in input dipole a, and self-impedance $Z_{aa}$ of input dipole a appears to be $$Z_{aa} \rightarrow Z_{aa} + Z_i.$$

Input impedance $Z_o$ of input 2 is inserted in input dipole b, and self-impedance $Z_{bb}$ of input dipole b appears to be $$Z_{bb} \rightarrow Z_{bb} + Z_o.$$

Also, the reason that the term "$Z_{ba}-A_v \times Z_i$" appears is that terms relating to dependent voltage source $E_{o1}$ are moved from the right side to the left side. The reason that the terms "$Z_{bc}-A_M$" and "$Z_{bd}+A_M$" appear is that terms relating to dependent voltage source $E_{o2}$ are moved from the right side to the left side.

While a detailed explanation of an operational process for simulation when an amplifier has a plurality of input terminals was not provided with respect to FIGS. 12 and 13, the simulation program 100, matching the amplification characteristics of the amplifier, inserts dipoles into the input terminals, and matching the amplification characteristics of the amplifier, inserts a dependent voltage source into the output terminal.

Figure 35:
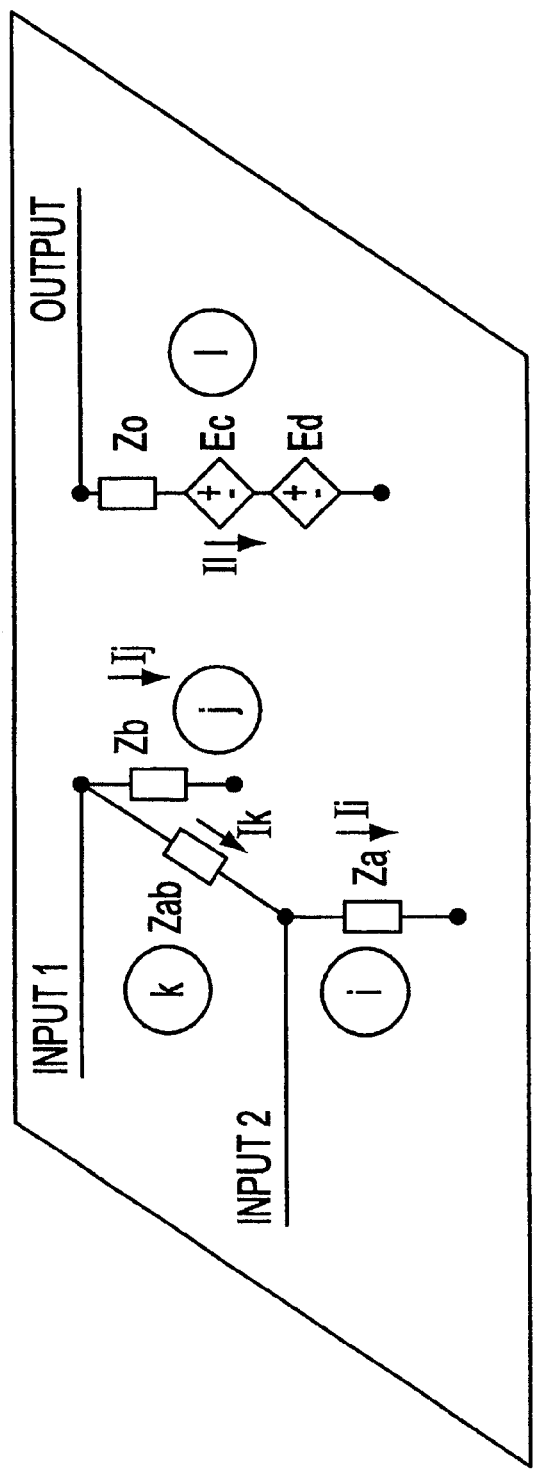
FIG. 35 is a diagram of a simulation model created in accordance with the embodiments of the present invention.

For example, as shown in FIG. 35, when the electronic device to be simulated has an amplifier that computes and outputs the sum of the voltage obtained when the input voltage differential of the two inputs ($V_a-V_b$) is multiplied by amplification rate $A_d$ and the voltage obtained when the average of those voltages ($V_a+V_b$)/2 is multiplied by "$1/A_c$", dipole i is allocated to amplifier input 2, dipole j is allocated to amplifier input 1, dipole k is allocated between amplifier input 1 and input 2, and dipole 1 is allocated to the amplifier output. Also, input 2 input impedance $Z_a$ is inserted in dipole i, input 1 input impedance $Z_b$ is inserted in dipole j, input impedance $Z_{ab}$ corresponding to the impedance between input 1 and input 2 is inserted in dipole k, and output impedance $Z_o$ is inserted in dipole 1.

Then, matching the amplification characteristics of this amplifier, dependent voltage source $E_c$ is inserted into dipole i, which generates the following voltage:

$$E_c=[(V_a+V_b)/2]\times(1/A_c)$$
$$=(Z_a \times I_i+Z_b \times I_j)/2A_c$$
$$=(Z_a \times I_i)/2A_c+(Z_b \times I_j)/2A_c,$$

where $I_i$ is the electric current flowing in dipole i, and $I_j$ is the electric current flowing in dipole j.

Further, dependent voltage source $E_k$ is also inserted into dipole i, which generates the following voltage:

$$E_d=(V_a-V_b)\times A_d=Z_{ab}\times A_d \times I_k;$$

where $I_k$ is the electric current flowing in dipole k.

Figure 36:
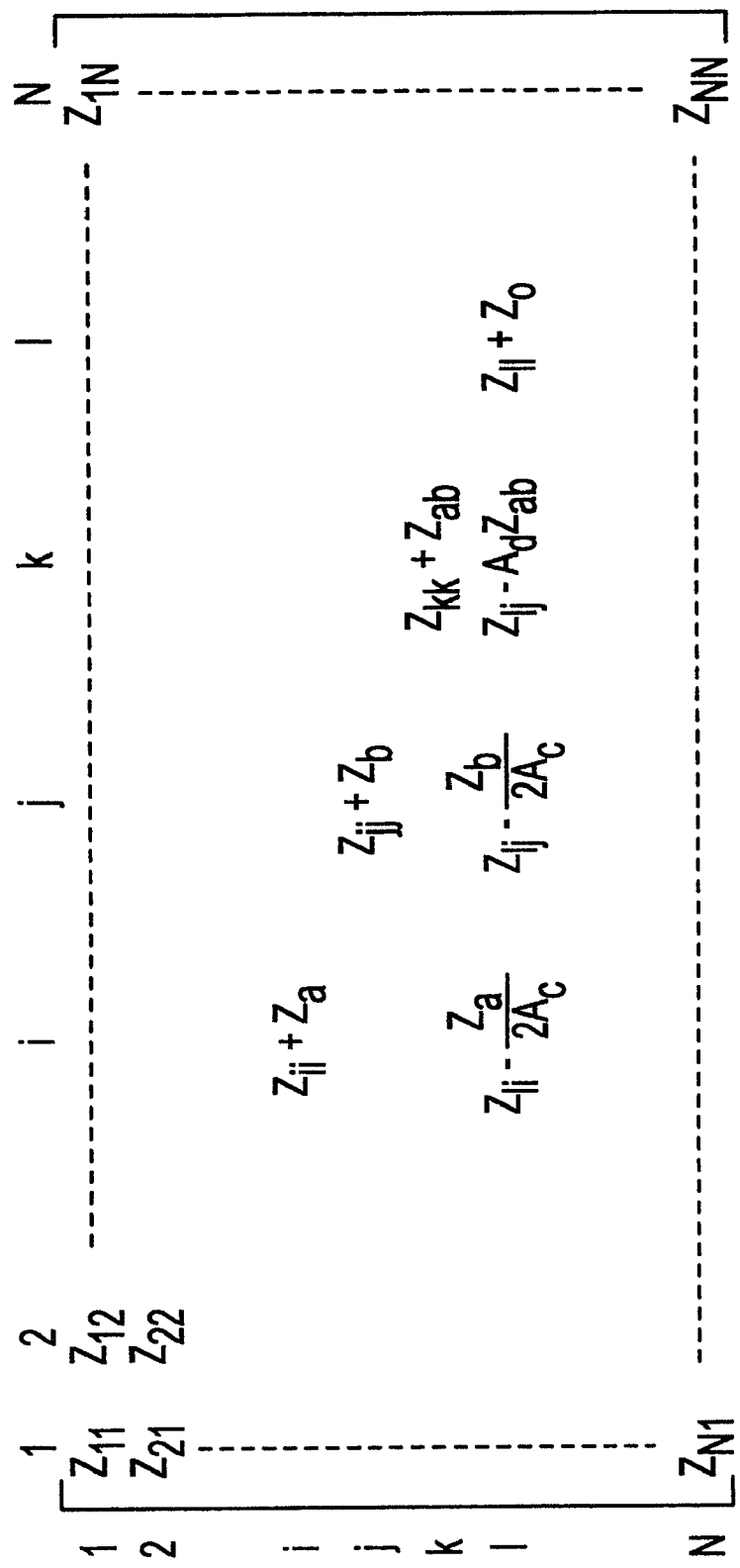
FIG. 36 is a diagram of a simultaneous equation of the moment method in accordance with the embodiments of the present invention.

Then, in accordance with this simulation model, the simulation program 100 creates a simultaneous equation of the moment method with a matrix of the mutual impedance shown in FIG. 36. By solving the simultaneous equation of the moment method shown in FIG. 36, the electric current flowing in the electronic device is simulated.

Figure 37:
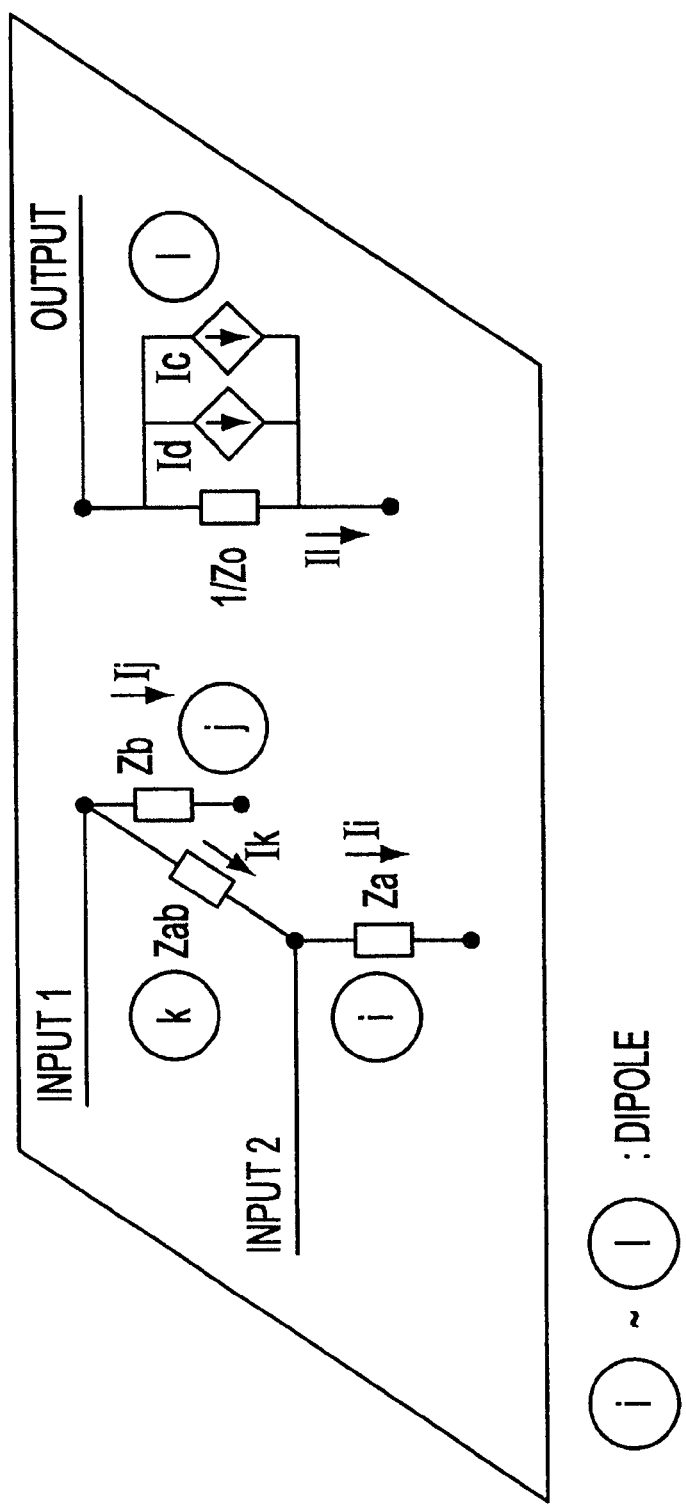
FIG. 37 is a diagram of a simulation model created in accordance with the embodiments of the present invention.

Also, for example, as shown in FIG. 37, when the electronic device to be simulated has an amplifier that computes and outputs the sum of the electric current obtained when the input voltage differential of the two inputs ($V_a-V_b$) is multiplied by amplification rate $A_d$ and the electric current obtained when the average of those voltages ($V_a+V_b$)/2 is multiplied by "$1/A_c$," dipole i is allocated to amplifier input 2, dipole j is allocated to amplifier input 1, dipole k is allocated between amplifier input 1 and input 2, and dipole 1 is allocated to the amplifier output. Also, input 2 input impedance $Z_a$ is inserted in dipole i, input 1 input impedance $Z_b$ is inserted in dipole j, input impedance $Z_{ab}$ corresponding to the impedance between input 1 and input 2 is inserted in dipole k, and output impedance $Z_o$ is inserted in dipole 1.

Then, output currents $I_c$ and $I_d$ of this amplifier become:

$$I_c=[(V_a+V_b)/2]\times(1/A_c)$$
$$=(Z_a \times I_i+Z_b \times I_j)/2A_c$$
$$=(Z_a \times I_i)/2A_c+(Z_b \times I_j)/2A_c,$$

where $I_i$ is the electric current flowing in dipole i, and $I_j$ is the electric current flowing in dipole j $$I_d=(V_a-V_b)\times A_d=Z_{ab}\times A_d \times I_k,$$

where $I_k$ is the electric current flowing in dipole k.

Thus, in accordance with a pattern that is the same as the pattern shown in FIG. 35, inserted into dipole 1 are dependent voltage source $E_c$ which generates the following voltage:

$$E_c=Z_o \times I_c=(Z_a \times Z_o \times I_i)/2A_c+(Z_b \times Z_o \times I_j)/2A_c,$$

and dependent voltage source $E_k$ which generates the following voltage:

$$E_d=Z_o \times I_d=Z_{ab}\times Z_o \times A_d \times I_k.$$

Figure 38:
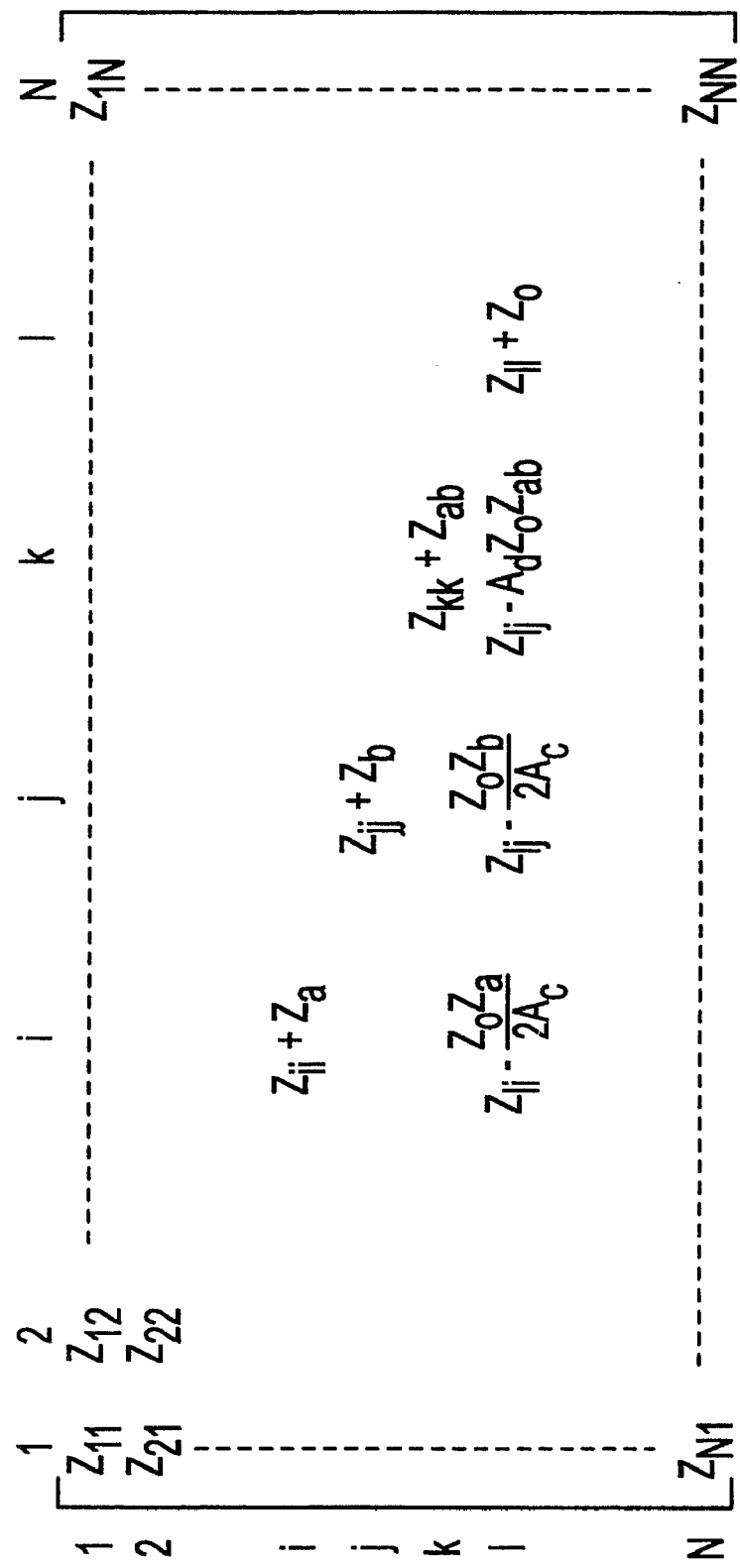
FIG. 38 is a diagram of a simultaneous equation of the moment method in accordance with the embodiments of the present invention.

Then, in accordance with this simulation model, the simulation program 100 creates a simultaneous equation of the moment method with a matrix of the mutual impedance shown in FIG. 38. By solving the simultaneous equation shown in FIG. 38, the electric current flowing in the electronic device is simulated.

In the above-described manner, when simulating the electric current flowing in an electronic device using the moment method, when the electronic device to be simulated has an amplifier, the simulation program 100 provides to the amplifier output a dependent voltage source that generates voltage and electric current dependent upon the amplifier's input voltage and input current, thereby creating an accurate simulation of the amplifier.

The present invention is not limited to the embodiments described hereinabove. For example, in the operational process shown in FIG. 12 and FIG. 13, after dipoles are allocated to the amplifier input and output, the amplifier input impedance is inserted into the input dipole thus allocated, and the amplifier output impedance, or its inverse, and a dependent voltage source are inserted into the output dipole thus allocated. Then, a simultaneous equation of the moment method is determined by computing the mutual impedance between the dipoles. However, a configuration may be employed such that the dipoles are allocated to the amplifier input and output, the mutual impedance between the dipoles is computed, and thereafter, using the input impedance, the output impedance, and the dependent energy source, the simultaneous equation of the moment method is computed by modifying the mutual impedance thus computed.

Furthermore, embodiments of the present invention have been described hereinabove without consideration of dielectric substances that electronic devices may have. However, the present invention may be applied to electronic devices having dielectric substances.

As described hereinabove, with the simulation device in accordance with the present invention, when the electric current flowing in an electronic device is simulated using the moment method, and the electronic device has an amplifier, by providing to the amplifier output a dependent voltage source that generates voltage and current dependent upon the input voltage and input current of the amplifier input, an accurate simulation model of the amplifier is created. Moreover, by employing a configuration that executes simulation processing pursuant to this model, an accurate simulation processing can be executed when an electronic device has an amplifier. Accordingly, an accurate simulation of the intensity of the electromagnetic field radiated by electronic devices can be made, and the state of electronic devices affected by radio waves can be accurately simulated.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A simulation device to simulate current flowing in an electronic device by solving a simultaneous equation of the moment method derived by partitioning the electronic device into elements, the electronic device including an amplifier having an input terminal and an output terminal, comprising:

allocating means for allocating respective dipoles to the input terminal and the output terminal to derive the current flowing in the elements;

creating means for creating a simultaneous equation of the moment method having a form such that an input impedance of the amplifier is inserted at the input terminal dipole allocated by the allocating means, and one of an output impedance of the amplifier or an inverse of the output impedance of the amplifier, and a dependent voltage source corresponding to amplifying characteristics of the amplifier, are inserted at the output terminal dipole allocated by the allocating means; and solution means for solving the simultaneous equation of the moment method created by the creating means.

2. A simulation device as recited in claim 1, wherein the amplifier includes a plurality of input terminals, and the allocating means allocates dipoles to the input terminals in a form corresponding to the amplifying characteristics of the amplifier.

3. A simulation device as recited in claim 1, wherein the amplifier is a voltage amplifier, and the creating means creates a simultaneous equation of the moment method having a form such that the output impedance of the amplifier is inserted at the output terminal dipole.

4. A simulation device as recited in claim 2, wherein the amplifier is a voltage amplifier, and the creating means creates a simultaneous equation of the moment method having a form such that the output impedance of the amplifier is inserted at the output terminal dipole.

5. A simulation device as recited in claim 1, wherein the amplifier is a current amplifier, and the creating means creates a simultaneous equation of the moment method having a form such that the inverse of output impedance of the amplifier is inserted at the output terminal dipole.

6. A simulation device as recited in claim 2, wherein the amplifier is a current amplifier, and the creating means creates a simultaneous equation of the moment method having a form such that the inverse of output impedance of the amplifier is inserted at the output terminal dipole.

7. A simulation device as recited in claim 1, wherein the output voltage of the amplifier is dependent upon the input voltage, and the creating means creates a simultaneous equation of the moment method having a form such that the dependent voltage source inserted at the output terminal dipole generates a voltage corresponding to a product of the input impedance of the amplifier, an amplification rate of the amplifier, and a current flowing in the dipole of the input terminal.

8. A simulation device as recited in claim 2, wherein the output voltage of the amplifier is dependent upon the input voltage, and the creating means creates a simultaneous equation of the moment method having a form such that the dependent voltage source inserted at the output terminal dipole generates a voltage corresponding to a product of the input impedance of the amplifier, an amplification rate of the amplifier, and a current flowing in the dipole of the input terminal.

9. A simulation device as recited in claim 1, wherein the output voltage of the amplifier is dependent upon the input current, and the creating means creates a simultaneous equation of the moment method having a form such that the dependent voltage source inserted at the output terminal dipole generates a voltage corresponding to a product of an amplification rate of the amplifier and a current flowing in the dipole of the input terminal.

10. A simulation device as recited in claim 2, wherein the output voltage of the amplifier is dependent upon the input current, and the creating means creates a simultaneous equation of the moment method having a form such that the dependent voltage source inserted at the output terminal dipole generates a voltage corresponding to a product of an amplification rate of the amplifier and a current flowing in the dipole of the input terminal.

11. A simulation device as recited in claim 1, wherein the output current of the amplifier is dependent upon the input voltage, and the creating means creates a simultaneous equation of the moment method having a form such that the dependent voltage source inserted at the output terminal dipole generates a voltage corresponding to a product of the input impedance of the amplifier, the output impedance of the amplifier, an amplification rate of the amplifier and a current flowing in the dipole of the input terminal.

12. A simulation device as recited in claim 2, wherein the output current of the amplifier is dependent upon the input voltage, and the creating means creates a simultaneous equation of the moment method having a form such that the dependent voltage source inserted at the output terminal dipole generates a voltage corresponding to a product of the input impedance of the amplifier, the output impedance of the amplifier, the amplification rate of the amplifier and a current flowing in the dipole of the input terminal.

13. A simulation device as recited in claim 1, wherein the output current of the amplifier is dependent upon the input current, and the creating means creates a simultaneous equation of the moment method having a form such that the dependent voltage source inserted at the output terminal dipole generates a voltage corresponding to a product of the output impedance of the amplifier, an amplification rate of the amplifier and a current flowing in the input terminal dipole.

14. A simulation device as recited in claim 2, wherein the output current of the amplifier is dependent upon the input current, and the creating means creates a simultaneous equation of the moment method having a form such that the dependent voltage source inserted at the output terminal dipole generates a voltage corresponding to a product of the output impedance of the amplifier, an amplification rate of the amplifier and a current flowing in the input terminal dipole.

15. A simulation device as recited in claim 1, wherein
   the allocating means allocates a dipole between a source terminal of the amplifier and a ground terminal, and
   the creating means creates a simultaneous equation of the moment method having a form such that an impedance for observation corresponding to the impedance between the source terminal and the ground terminal is inserted at the dipole allocated between the source terminal and the ground terminal, and the dependent voltage source inserted at the output terminal dipole generates a voltage corresponding to a product of a value indicating the effect of a voltage between the source terminal and the ground terminal, the impedance for observation and current flowing in the dipole allocated between the source terminal and the ground terminal.

16. A simulation device as recited in claim 1, wherein the allocating means allocates a dipole between two points, and the creating means creates a simultaneous equation of the moment method having a form such that an impedance for observation corresponding to the impedance between the two points is inserted at the dipole allocated between the two points, and the dependent voltage source inserted at the output terminal dipole generates a voltage corresponding to a product of a value indicating the effect of a source voltage, the impedance for observation and current flowing in the dipole allocated between the two points.

17. A simulation device as recited in claim 1, wherein the allocating means allocates a dipole between two points, and the creating means creates a simultaneous equation of the moment method having a form such that the dependent voltage source inserted at the dipole of the output terminal generates a voltage corresponding to a product of a value indicating the effect of a current flowing between the two points and a current flowing in the dipole allocated between the two points.

18. A simulation method to simulate current flowing in an electronic device including an amplifier having an input terminal and an output terminal by solving simultaneous equations of the moment method derived by partitioning the electronic device into elements, comprising:

allocating to the input terminal and output terminal of the amplifier respective dipoles to derive the current flowing in the elements;

creating a simultaneous equation of the moment method having a form such that an input impedance of the amplifier is inserted at the input terminal dipole allocated to the input terminal, and one of an output impedance of the amplifier or an inverse of the output impedance of the amplifier, and a dependent voltage source corresponding to amplifying characteristics of the amplifier, are inserted at the output terminal dipole allocated to the output terminal; and solving the created simultaneous equation of the moment method.

19. A simulation method as recited in claim 18, wherein the amplifier includes a plurality of input terminals, and the step of allocating includes allocating dipoles to the input terminals in a form corresponding to the amplifying characteristics of the amplifier.

20. A simulation device method as recited in claim 18, wherein the amplifier is a voltage amplifier, and the step of creating includes means creating a simultaneous equation of the moment method having a form such that the output impedance of the amplifier is inserted at the output terminal dipole.

21. A simulation device method as recited in claim 19, wherein the amplifier is a voltage amplifier, and the step of creating includes creating a simultaneous equation of the moment method having a form such that the output impedance of the amplifier is inserted at the output terminal dipole.

22. A simulation device method as recited in claim 18, wherein the amplifier is a current amplifier, and the creating step includes creating a simultaneous equation of the moment method having a form such that the inverse of output impedance of the amplifier is inserted at the output terminal dipole.

23. A simulation device method as recited in claim 19, wherein the amplifier is a current amplifier, and the creating step includes creating a simultaneous equation of the moment method having a form such that the inverse of output impedance of the amplifier is inserted at the output terminal dipole.

24. A simulation method as recited in claim 18, wherein the output voltage of the amplifier is dependent upon the input voltage, and the step of creating includes creating a simultaneous equation of the moment method having a form such that the dependent voltage source inserted at the output terminal dipole generates a voltage corresponding to a product of the input impedance of the amplifier, an amplification rate of the amplifier, and a current flowing in the dipole of the input terminal.

25. A simulation method as recited in claim 19, wherein the output voltage of the amplifier is dependent upon the input voltage, and the step of creating includes creating a simultaneous equation of the moment method having a form such that the dependent voltage source inserted at the output terminal dipole generates a voltage corresponding to a product of the input impedance of the amplifier, an amplification rate of the amplifier, and a current flowing in the dipole of the input terminal.

26. A simulation method as recited in claim 18, wherein the output voltage of the amplifier is dependent upon the input current, and the step of creating includes creating a simultaneous equation of the moment method having a form such that the dependent voltage source inserted at the output terminal dipole generates a voltage corresponding to a product of an amplification rate of the amplifier and a current flowing in the dipole of the input terminal.

27. A simulation method as recited in claim 19, wherein the output voltage of the amplifier is dependent upon the input current, and the step of creating includes creating a simultaneous equation of the moment method having a form such that the dependent voltage source inserted at the output terminal dipole generates a voltage corresponding to a product of an amplification rate of the amplifier and a current flowing in the dipole of the input terminal.

28. A simulation method as recited in claim 18, wherein the output current of the amplifier is dependent upon the input voltage, and the step of creating includes creating a simultaneous equation of the moment method having a form such that the dependent voltage source inserted at the output terminal dipole generates a voltage corresponding to a product of the input impedance of the amplifier, the output impedance of the amplifier, an amplification rate of the amplifier and a current flowing in the dipole of the input terminal.

29. A simulation method as recited in claim 19, wherein the output current of the amplifier is dependent upon the input voltage, and the step of creating includes creating a simultaneous equation of the moment method having a form such that the dependent voltage source inserted at the output terminal dipole generates a voltage corresponding to a product of the input impedance of the amplifier, the output impedance of the amplifier, the amplification rate of the amplifier and a current flowing in the dipole of the input terminal.

30. A simulation method as recited in claim 18, wherein the output current of the amplifier is dependent upon the input current, and the step of creating includes creating a simultaneous equation of the moment method having a form such that the dependent voltage source inserted at the output terminal dipole generates a voltage corresponding to a product of the output impedance of the amplifier, an amplification rate of the amplifier and a current flowing in the input terminal dipole.

31. A simulation method as recited in claim 19, wherein the output current of the amplifier is dependent upon the input current, and the step of creating includes creating a simultaneous equation of the moment method having a form such that the dependent voltage source inserted at the output terminal dipole generates a voltage corresponding to a product of the output impedance of the amplifier, an amplification rate of the amplifier and a current flowing in the input terminal dipole.

32. A simulation method as recited in claim 18, wherein
the step of allocating includes allocating a dipole between a source terminal of the amplifier and a ground terminal, and
the step of creating includes creating a simultaneous equation of the moment method having a form such that an impedance for observation corresponding to the impedance between the source terminal and the ground terminal is inserted at the dipole allocated between the source terminal and the ground terminal, and the dependent voltage source inserted at the output terminal dipole generates a voltage corresponding to a product of a value indicating the effect of a voltage between the source terminal and the ground terminal, the impedance for observation and current flowing in the dipole allocated between the source terminal and the ground terminal.

33. A simulation method as recited in claim 18, wherein
the step of allocating includes allocating a dipole between two points, and
the step of creating includes creating a simultaneous equation of the moment method having a form such that an impedance for observation corresponding to the impedance between the two points is inserted at the dipole allocated between the two points, and the dependent voltage source inserted at the output terminal dipole generates a voltage corresponding to a product of a value indicating the effect of a source voltage, the impedance for observation and current flowing in the dipole allocated between the two points.

34. A simulation method as recited in claim 18, wherein
the step of allocating includes allocating a dipole between two points, and
the step of creating includes creating a simultaneous equation of the moment method having a form such that the dependent voltage source inserted at the dipole of the output terminal generates a voltage corresponding to a product of a value indicating the effect of a current flowing between the two points and a current flowing in the dipole allocated between the two points.

35. A computer readable medium encoded with processing instructions for implementing a simulation method to simulate the current flowing in an electronic device by solving a simultaneous equation of the moment method derived by partitioning the electronic device into elements, the electronic device including an amplifier having an input terminal and an output terminal, the simulation method comprising:
allocating to the input terminal and output terminal of the amplifier respective dipoles to derive the current flowing in the elements;
creating a simultaneous equation of the moment method having a form such that an input impedance of the amplifier is inserted at the input terminal dipole allocated to the input terminal, and one of an output impedance of the amplifier or an inverse of the output impedance of the amplifier, and a dependent voltage source corresponding to amplifying characteristics of the amplifier, are inserted at the output terminal dipole allocated to the output terminal; and
solving the created simultaneous equation of the moment method.

36. An apparatus, comprising:
a data storage device;
a processor connected to the data storage device,
the data storage device storing a program for controlling the processor, the processor operative with the program to:
allocate to an input terminal and an output terminal of an amplifier respective dipoles to derive the current flowing in an electronic device including the amplifier;
create a simultaneous equation of the moment method having a form such that an input impedance of the amplifier is inserted at the input terminal dipole allocated to the input terminal, and one of an output impedance of the amplifier or an inverse of the output impedance of the amplifier, and a dependent voltage source corresponding to amplifying characteristics of the amplifier, are inserted at the output terminal dipole allocated to the output terminal; and
solve the created simultaneous equation of the moment method.

* * * * *

UNITED STATES PATENT AND TRADEMARK OFFICE
CERTIFICATE OF CORRECTION

PATENT NO. : 6,845,351 B1
DATED : January 18, 2005
INVENTOR(S) : Takeshi Kishimoto et al.

It is certified that error appears in the above-identified patent and that said Letters Patent is hereby corrected as shown below:

<u>Title page,</u>
Item [54], Title, change to read -- SYSTEM AND METHOD OF SIMULATION BY ALLOCATING DIPOLES TO AMPLIFIER TERMINALS --.

Signed and Sealed this

Twenty-seventh Day of September, 2005

JON W. DUDAS
*Director of the United States Patent and Trademark Office*